US008941791B2

(12) United States Patent
Kim

(10) Patent No.: US 8,941,791 B2
(45) Date of Patent: Jan. 27, 2015

(54) LIQUID CRYSTAL DISPLAY DEVICE AND METHOD OF FABRICATING THE SAME

(71) Applicant: LG Display Co., Ltd., Seoul (KR)

(72) Inventor: Dong-Young Kim, Pungnil-ri (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/927,711

(22) Filed: Jun. 26, 2013

(65) Prior Publication Data

US 2013/0337617 A1 Dec. 19, 2013

Related U.S. Application Data

(62) Division of application No. 11/643,115, filed on Dec. 20, 2006, now Pat. No. 8,488,076.

(30) Foreign Application Priority Data

Jun. 29, 2006 (KR) .............................. 2006-0059346

(51) Int. Cl.
G02F 1/136 (2006.01)
G02F 1/1343 (2006.01)
H01L 29/66 (2006.01)
G02F 1/1362 (2006.01)
H01L 27/12 (2006.01)
G02F 1/1368 (2006.01)

(52) U.S. Cl.
CPC .... *H01L 29/66765* (2013.01); *G02F 1/136209* (2013.01); *H01L 27/1214* (2013.01); *G02F 1/1368* (2013.01); *G02F 2001/136295* (2013.01); *G02F 1/136227* (2013.01); *G02F 2001/136236* (2013.01)
USPC .............................. 349/43; 349/139; 349/140

(58) Field of Classification Search
USPC ............................................ 349/43, 139, 140
See application file for complete search history.

(56) References Cited

U.S. PATENT DOCUMENTS

| 6,678,017 | B1* | 1/2004 | Shimomaki et al. ............ 349/40 |
| 2003/0122978 | A1* | 7/2003 | Lim .............................. 349/42 |
| 2005/0041168 | A1 | 2/2005 | Jang et al. |
| 2005/0117079 | A1* | 6/2005 | Pak et al. ........................ 349/43 |
| 2005/0270434 | A1 | 12/2005 | Jung et al. |
| 2006/0262244 | A1* | 11/2006 | Cho et al. ........................ 349/84 |

FOREIGN PATENT DOCUMENTS

| JP | 2005-108912 | 4/2005 |
| JP | 2005-215276 | 8/2005 |

OTHER PUBLICATIONS

Office Action issued in corresponding Japanese Patent Application No. 2006-353326; issued Mar. 15, 2010.
Office Action issued in corresponding Chinese Patent Application No. 20610169000.X; issued Apr. 19, 2010.

* cited by examiner

*Primary Examiner* — Jerry Blevins
(74) *Attorney, Agent, or Firm* — Brinks Gilson & Lione

(57) ABSTRACT

A liquid crystal display device includes a gate line and a gate electrode connected to the gate line, on a substrate; a gate insulating layer on the gate electrode and the gate line; an active layer on the gate insulating layer over the gate electrode; an ohmic contact layer on the active layer; first source and drain electrodes on the ohmic contact layer; second source and drain electrodes connected to the first source and drain electrodes, respectively; a data line extending from the source electrode and crossing the gate line to define a pixel region; and a pixel electrode in the pixel region and extending from the second drain electrode.

16 Claims, 36 Drawing Sheets

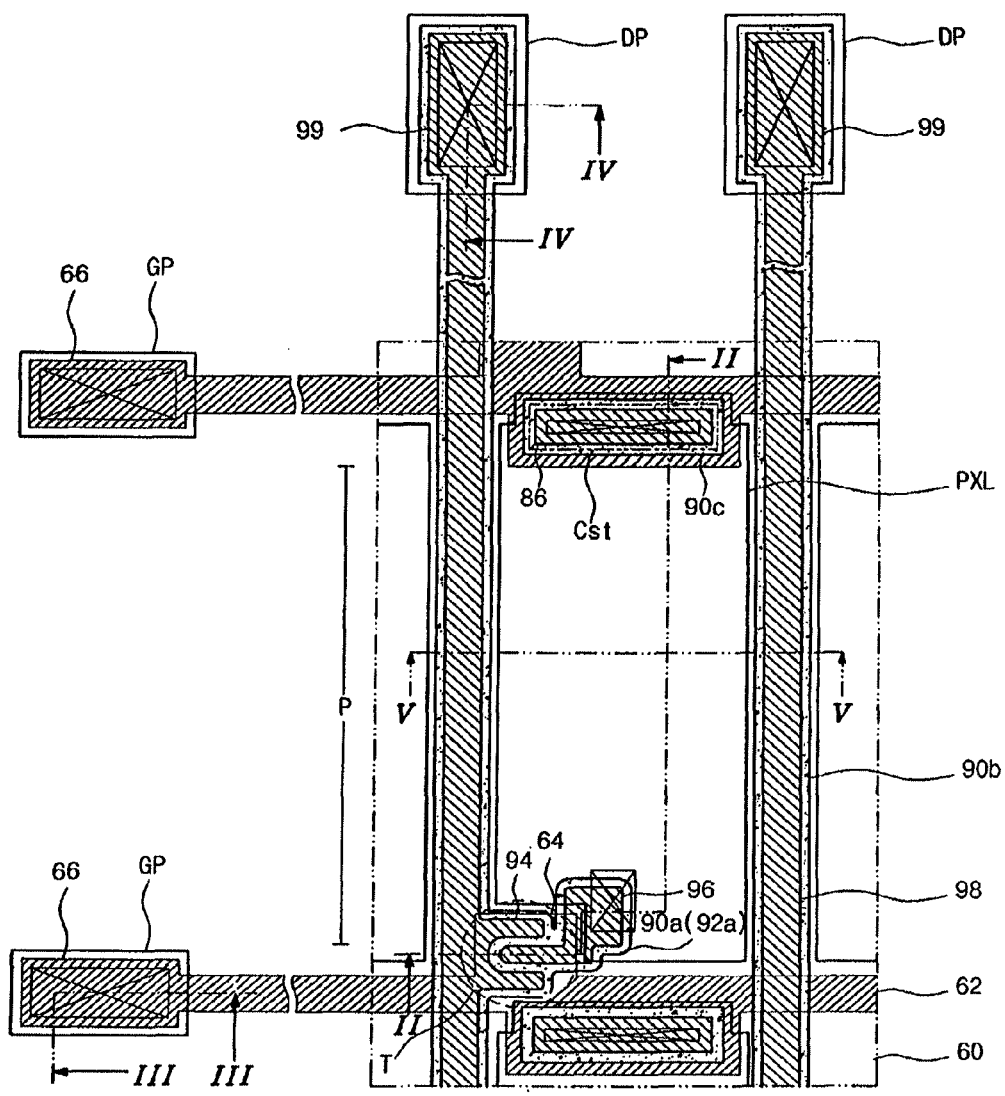

FIG. 6A
RELATED ART
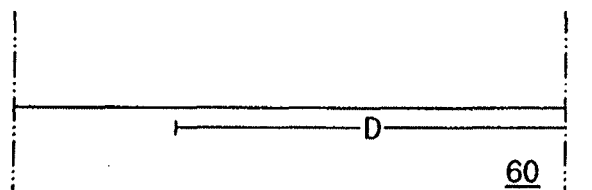
FIG. 6B
RELATED ART
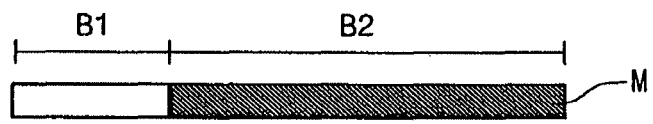
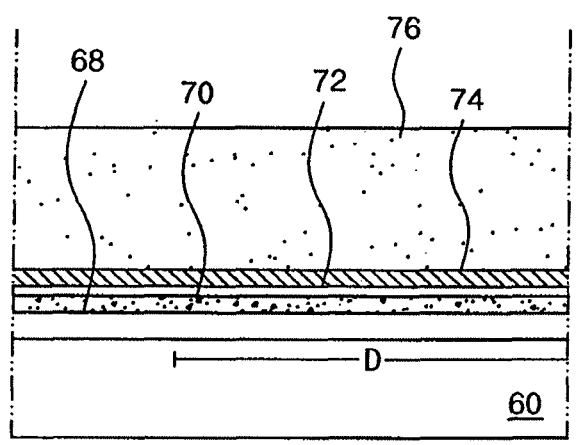

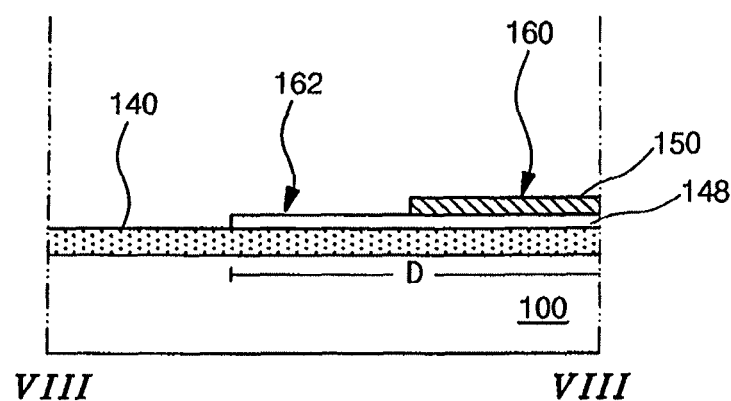

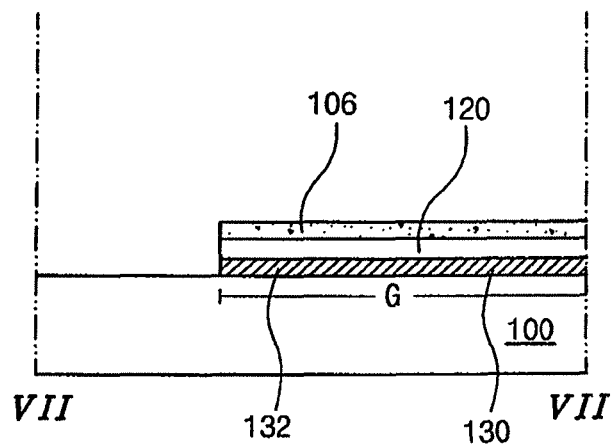
FIG. 10C
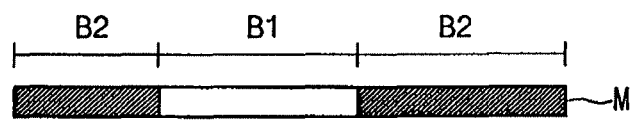
FIG. 10D
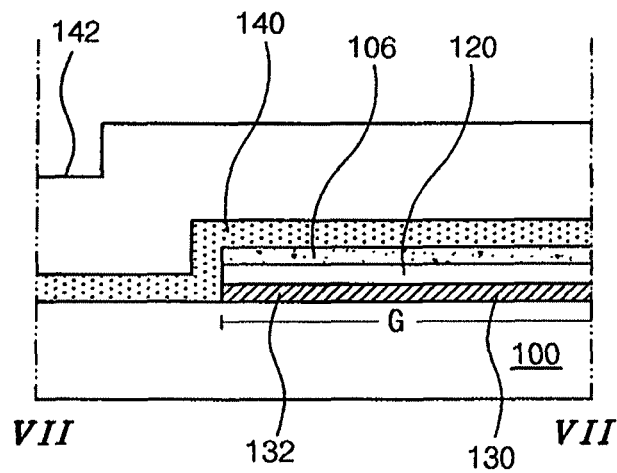

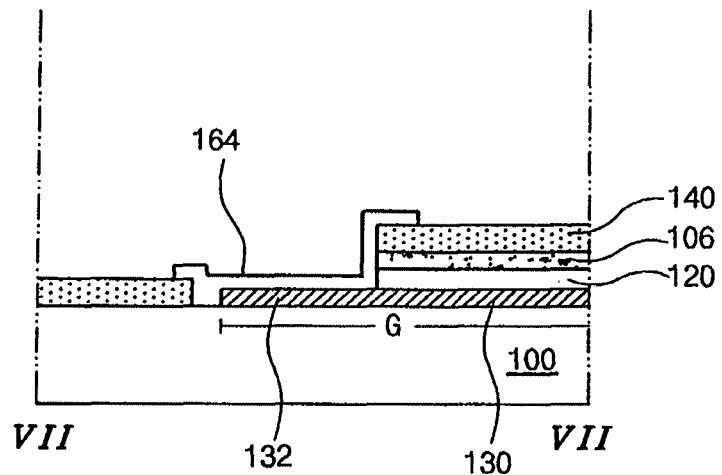
FIG. 10M
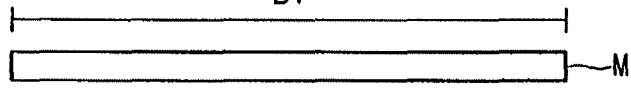
FIG. 11A
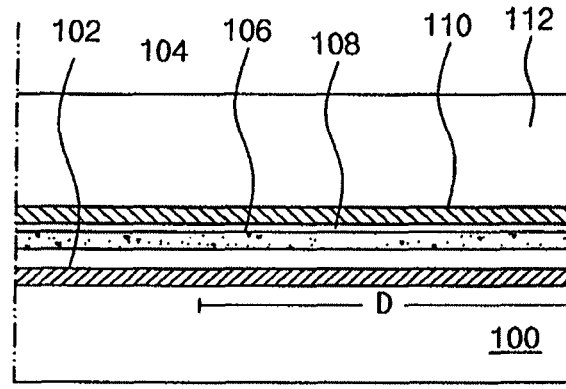

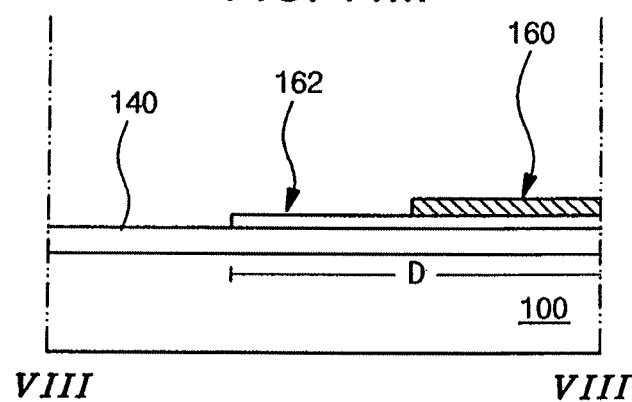

LIQUID CRYSTAL DISPLAY DEVICE AND METHOD OF FABRICATING THE SAME

The present patent document is a divisional of U.S. patent application Ser. No. 11/643,115, filed Dec. 20, 2006; which claims priority to Korean Patent Application No. 2006-0059346 filed in Korea on Jun. 29, 2006, all of which are hereby incorporated by reference.

BACKGROUND

1. Technical Field

The present invention relates to a liquid crystal display device, and more particularly, to a liquid crystal display (LCD) device and a method of fabricating the same.

2. Discussion of the Related Art

Until recently, display devices have typically used cathode-ray tubes (CRTs). Presently, many efforts are being made to study and develop various types of flat panel displays, such as liquid crystal display (LCD) devices, plasma display panels (PDPs), field emission displays, and electro-luminescence displays (ELDs), as a substitute for CRTs. Of these flat panel displays, the LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into direction of the induced electric field, thereby changing the light transmissivity of the LCD device. Thus, the LCD device displays images by varying the intensity of the induced electric field.

FIG. 1 is a perspective view illustrating a LCD device according to the related art.

Referring to FIG. 1, the LCD device 51 includes an array substrate, a color filter substrate and a liquid crystal layer between the two substrates.

The color filter substrate includes a black matrix 6, and red (R), green (G) and blue (B) color filter patterns 7a, 7b and 7c on a second substrate 5. A common electrode 9 is disposed on the color filter patterns 7a, 7b and 7c.

The array substrate includes a gate line 14 and a data line 26 crossing each other on a first substrate 10 to define a pixel region P. A thin film transistor T is disposed near a crossing portion of the gate and data lines 14 and 26. A pixel electrode 32 is disposed in the pixel region P and connected to the thin film transistor T.

The array substrate is fabricated with five mask processes. A gate electrode and the gate line are formed in a first mask process. A semiconductor layer is formed in a second mask process. A data line and source and drain electrodes are formed in a third mask process. A passivation layer having a contact hole exposing the drain electrode is formed in a fourth mask process. A pixel electrode is formed in a fifth mask process.

Because the array substrate is fabricated with the five mask processes, fabrication time and product cost increase. To resolve this problem, a method of fabricating an array substrate with four mask processes is suggested.

FIG. 2 is a plan view illustrating an array substrate for an LCD device fabricated with four mask processes according to the related art.

Referring to FIG. 2, a gate line 62 and a data line 98 cross each other on a substrate to define a pixel region P. A gate pad 66 is disposed at one end of the gate line 62, and a data pad 99 is disposed at one end of the data line 98. A gate pad electrode GP is disposed on the gate pad 66, and a data pad electrode DP is disposed on the data pad 99.

A thin film transistor T is disposed near a crossing portion of the gate and data lines 62 and 98. The thin film transistor T includes a gate electrode 64, a first semiconductor layer 90a, and source and drain electrodes 94 and 96. A pixel electrode PXL is disposed in the pixel region P and contacts the drain electrode 96.

A storage electrode 86 overlaps the gate line 62. The storage electrode 86, the gate line 62 and a gate insulating layer therebetween form a storage capacitor Cst.

A second semiconductor layer 90b is disposed below the data line 98, and a third semiconductor layer 90c is disposed below the storage electrode 86.

A portion of an active layer 92a of the first semiconductor layer 90a is not covered by the gate electrode 64. The portion of the active layer 92a is exposed to light such as backlight, and thus a photo current is generated. This photo current becomes a leakage current in the thin film transistor T.

Further, because metal patterns such as the data line 98, the storage electrode 86 and the source and drain electrodes 94 and 96, and the semiconductor patterns such as the first to third semiconductor layers 90a to 90c are formed with the same mask process, intrinsic amorphous silicon layers of the semiconductor patterns protrudes outside the metal patterns. The protruded portion of the intrinsic amorphous silicon layer of the second semiconductor layer 90b is also exposed to light such as backlight, and thus a photo current is generated. This causes a coupling with the pixel electrode PXL, and wavy noise occurs when displaying images.

FIGS. 3A and 3B are cross-sectional views taken along lines II-II and V-V of FIG. 2, respectively.

Referring to FIGS. 3A to 3B, when the array substrate is fabricated with the four mask processes, first and second semiconductor layers 90a and 90b are formed below source and drain electrodes 94 and 96 and data line 98, respectively. A passivation layer PAS is on the source and drain electrodes 94 and 96.

The first semiconductor layer 90a includes an active layer 92a of intrinsic amorphous silicon and an ohmic contact layer 92b of impurity-doped amorphous silicon. The second semiconductor layer 90b includes an intrinsic amorphous silicon layer 70 and an impurity-doped amorphous silicon layer 72.

A portion of the active layer 92a is not covered by a gate electrode 64. The portion of the active layer 92a is exposed to light such as backlight, and thus a photo current is generated. This photo current becomes a leakage current in a thin film transistor T. When the leakage current is generated, a voltage charged in a pixel region P abnormally leaks through the thin film transistor T. Accordingly, characteristics of the thin film transistor T are degraded.

Further, the intrinsic amorphous silicon layer 70 of the second semiconductor layer 90b protrudes outside the data line 98. When the protruded portion of the intrinsic amorphous silicon layer 70 is exposed to light such as backlight, it is repeatedly activated and inactivated, and thus a photo current is generated. The photo current is coupled with the signal on a pixel electrode PXL, and arrangement of liquid crystal molecules is abnormally distorted. Accordingly, a wavy noise occurs that wave-shaped thin lines are displayed in a screen of the LCD device.

A distance between the data line 98 and the pixel electrode is generally about 4.75 um in consideration of alignment error. The intrinsic amorphous silicon layer 70 of the second semiconductor layer 90b protrudes outside the data line 98 with about 1.7 um. In the related art, a distance D between the data line 98 and the pixel electrode PXL is about 6.45 um (=4.75 um+1.7 um) due to the protrusion of the intrinsic amorphous silicon layer 70. Accordingly, the pixel electrode PXL is far away from the data line 98, and a width W1 of a black matrix BM to shield the data line 98 and the distance D increases, thus aperture ratio is reduced.

The above problems relate to the four mask processes according to the related art.

FIGS. 4A to 4G, 5A to 5G and 6A to 6G are cross-sectional views, taken along II-II, and IV-IV of FIG. 2, respectively, illustrating a method of fabricating an array substrate for an LCD device with four mask processes according to the related art.

Referring to FIGS. 4A, 5A and 6A, a metallic material is deposited on a substrate 60 having a pixel region P, a switching region S, a gate region G, a data region D and a storage region C. The metallic material layer is patterned with a first mask process to form a gate line 62, a gate pad 66 and a gate electrode 64.

Referring to FIGS. 4B, 5B and 6B, a gate insulating layer 68, an intrinsic amorphous silicon layer 70, an impurity-doped amorphous silicon layer 72 and a metallic material layer 74 are formed on the substrate 60 having the gate line 62. A photoresist layer 76 is formed on the metallic material layer 74. A second mask M is disposed over the photoresist layer 76. The second mask M has a transmitting portion B1, a blocking portion B2 and a semi-transmitting portion B3. The semi-transmitting portion B3 and the blocking portions B2 at both sides of the semi-transmitting portion B3 correspond to the switching region S. The blocking portion B2 corresponds to the storage region S. The blocking portion B2 corresponds to the data region D. The photoresist layer 76 is exposed to light using the second mask M.

Referring to FIGS. 4C, 5C and 6C, first to third photoresist patterns 78a to 78c are formed in the switching region S, the data region D and the storage region S, respectively. The metallic material layer 74, the impurity-doped amorphous silicon layer 72 and the intrinsic amorphous silicon layer 70 are etched using the first to third photoresist patterns 78a to 78c.

Referring to FIGS. 4D, 5D and 6D, first to third metal patterns 80, 82 and 86 are formed below the first to third photoresist patterns 78a to 78c. First to third semiconductor layers 90a to 90c are formed below the first to third metal patterns 80, 82 and 86. An ashing process is performed for the first to third photoresist patterns 78a to 78c to remove a thinner portion of the first photoresist pattern 78a. By the ashing process, the sides of the first to third photoresist patterns 78a to 78c are also removed. The first to third metal patterns 80, 82 and 86 and the impurity-doped amorphous silicon layer 72 of the first to third semiconductor layers 90a to 90c are etched with the ashed first to third photoresist patterns 78a to 78c.

Referring to FIGS. 4E, 5E and 6E, source and drain electrodes 94 and 96, a data line 98 and a data pad 99 are formed. The third metal pattern 86 is referred to as a storage electrode 86. The impurity-doped amorphous silicon layer of the first semiconductor layer 90a is referred to as an ohmic contact layer 92b, and the intrinsic amorphous silicon layer of the first semiconductor layer 90a is referred to as an active layer 92a. The storage electrode 86 forms a storage capacitor Cst with the gate line 62.

When the first to third metal patterns (80, 82 and 86 of FIGS. 4D, 5D and 6D) and the first to third semiconductor layers (90a to 90c of FIGS. 4D, 5D and 6D) are etched using the first to third ashed photoresist patterns 78a to 78c, the active layer 92a is over-etched so that impurities do not remain on the active layer 92a.

Referring to FIGS. 4F, 5F, and 6F, a passivation layer PAS is formed on the substrate 60 having the data line 98. The passivation layer PAS is patterned with a third mask process to form a drain contact hole CH1 exposing the drain electrode 96, a storage contact hole CH2 exposing the storage electrode 86, and a data pad contact hole CH4 exposing the data pad 99. Also, the passivation layer PAS and the gate insulating layer 68 are patterned with the third mask process to form a gate pad contact hole CH3 exposing the gate pad 66.

Referring to FIGS. 4G, 5G and 6G, a transparent conductive material is deposited on the passivation layer PAS and patterned with a fourth mask process to form a pixel electrode PXL, a gate pad electrode GP and a data pad electrode DP. The pixel electrode PXL contacts the drain electrode 96 through the drain contact hole CH1 and the storage electrode 86 through the storage contact hole CH2. The gate pad electrode GP contacts the gate pad 66 through the gate pad contact hole CH3, and the data pad electrode DP contacts the data pad 99 through the data pad contact hole CH4.

Through the above four mask processes, the array substrate is fabricated. As explained above, the intrinsic amorphous silicon layer of the second semiconductor layer protrudes outside the data line. Accordingly, wavy noise occurs and aperture ratio is reduced.

Further, the portion of the active layer is not covered by the gate electrode. Accordingly, the leakage current is generated in the thin film transistor. Also, because the active layer should be formed thickly in consideration of the over-etching, fabrication time and product cost increase.

SUMMARY

Accordingly, the present invention is directed to a liquid crystal display device and a method of fabricating the same that substantially obviates one or more of problems due to limitations and disadvantages of the related art.

Additional features and advantages of the invention will be set forth in the description which follows, and in part will be apparent from the description, or may be learned by practice of the invention. The other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a gate line and a gate electrode on a substrate where the gate electrode is connected to the gate line. A gate insulating layer overlies the gate electrode and the gate line and an active layer overlies the gate insulating layer. An ohmic contact layer overlies the active layer and first source and drain electrodes overlie the ohmic contact layer. Second source and drain electrodes are connected to the first source and drain electrodes, respectively and a data line extends from the source electrode and crossing the gate line to define a pixel region. A pixel electrode resides in the pixel region and extends from the second drain electrode.

In another aspect, a method of fabricating a liquid crystal display device includes using a first mask process to form a gate line, a gate pad extending from the gate line and a gate electrode on a substrate, a gate insulating layer on the gate electrode and the gate line, an active layer on the gate insulating layer over the gate electrode, an ohmic contact layer on the active layer, and first source and drain electrodes on the ohmic contact layer. A second mask process is used to form a passivation layer covering the active layer between the first source and drain electrodes. A third mask process is used to form second source and drain electrodes connected to the first source and drain electrodes, respectively, and a data line extending from the source electrode and crossing the gate line to define a pixel region. A data pad electrode is formed extending from the data line, and a pixel electrode is formed in the pixel region and extending from the second drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 2 is a plan view illustrating an array substrate for an LCD device fabricated with four mask processes according to the related art;

FIGS. 4A to 4G, 5A to 5G and 6A to 6G are cross-sectional views, taken along II-II, III-III and IV-IV of FIG. 2, respectively, illustrating a method of fabricating an array substrate for an LCD device with four mask processes according to the related art;

FIGS. 8A, 8B and 8C are cross-sectional views taken along lines VI-VI, VII-VII and VIII-VIII, respectively; and FIGS. 9A to 9M, 10A to 10M and 11A to 11M are cross-sectional views, taken along lines VI-VI, VII-VII and VIII-VIII of FIG. 7, illustrating a method of fabricating an array substrate for an LCD device according to the embodiment of the present invention.

DETAILED DESCRIPTION

Reference will now be made in detail to the illustrated embodiments of the present invention, which are illustrated in the accompanying drawings.

Figure 1:
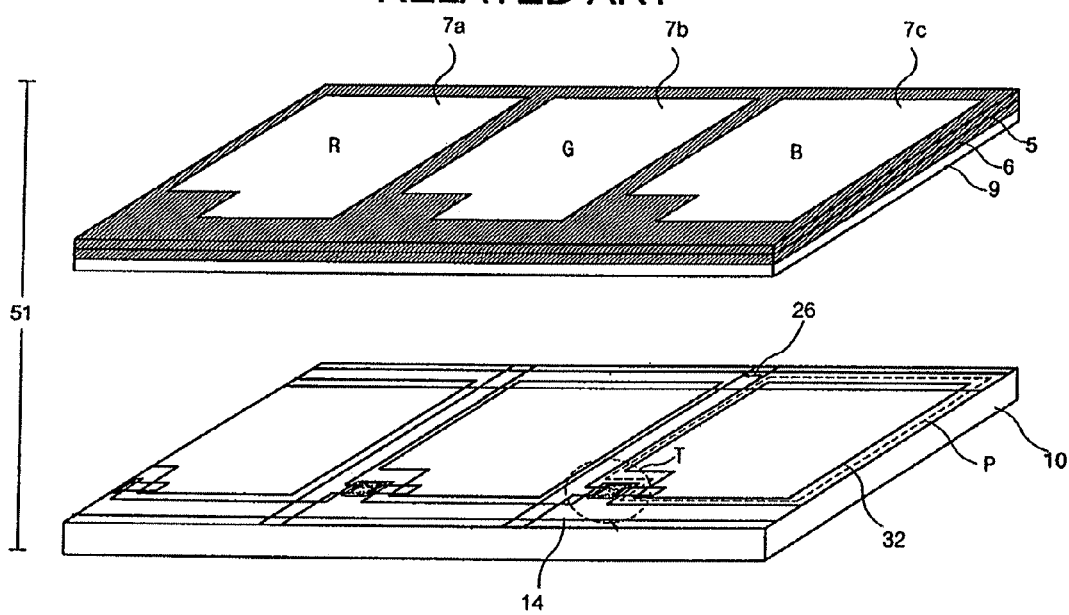
FIG. 1 is a perspective view illustrating a LCD device according to the related art.
Figure 3A:
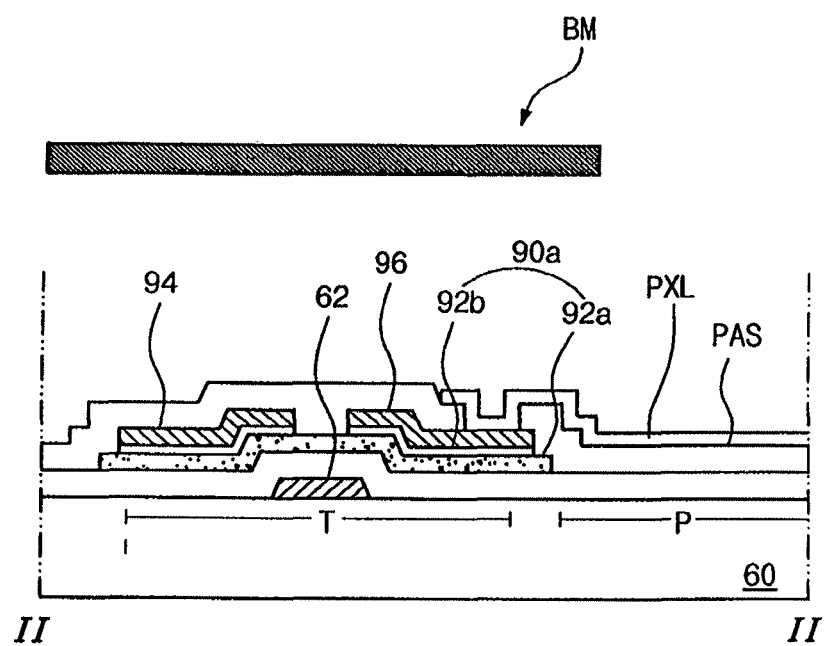
FIGS. 3A and 3B are cross-sectional views taken along lines II-II and V-V of FIG. 2, respectively.
Figure 3B:
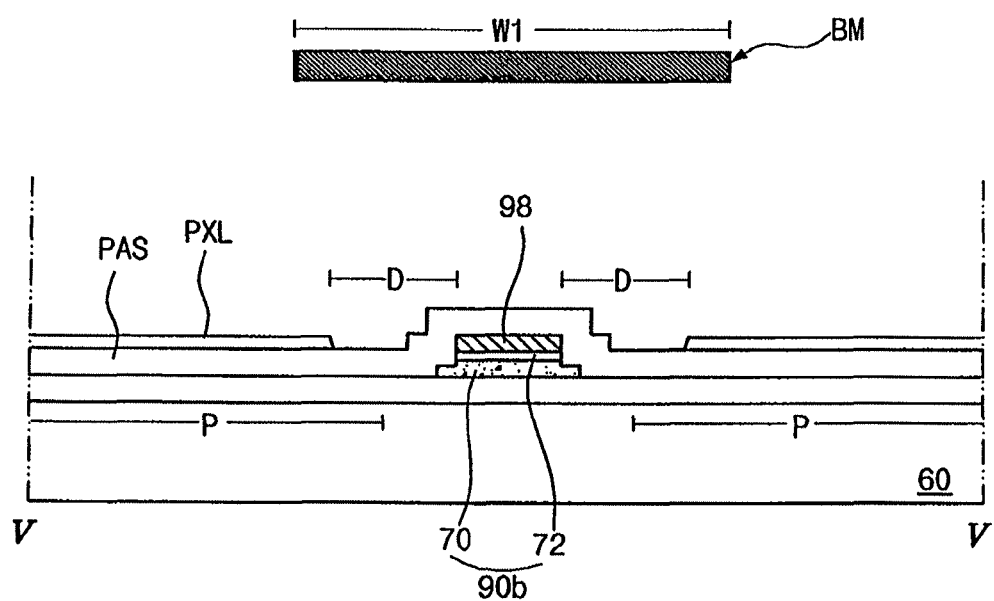
Figure 4A:
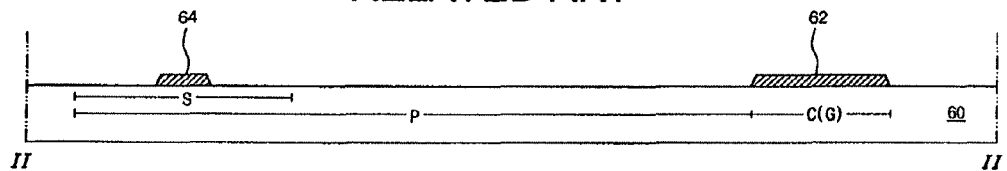
Figure 4B:
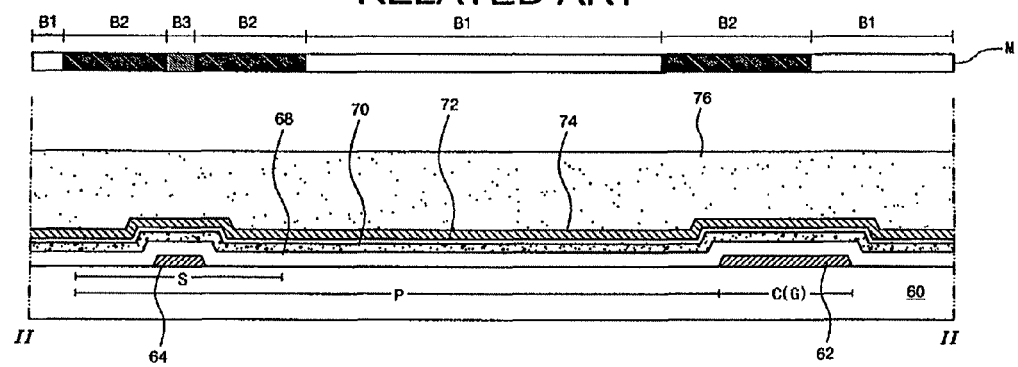
Figure 4C:
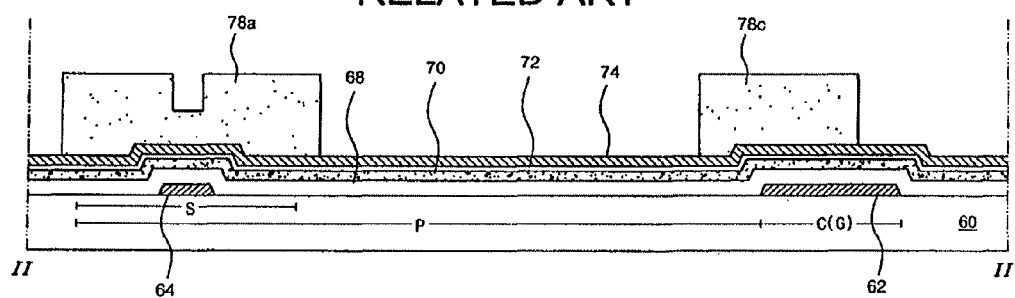
Figure 4D:
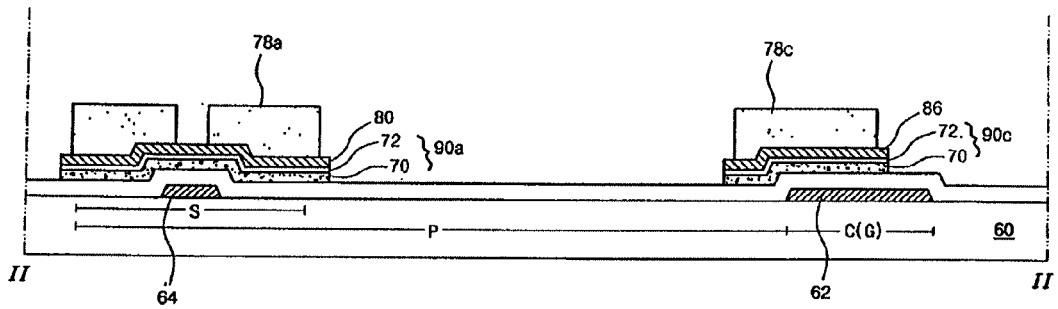
Figure 4E:
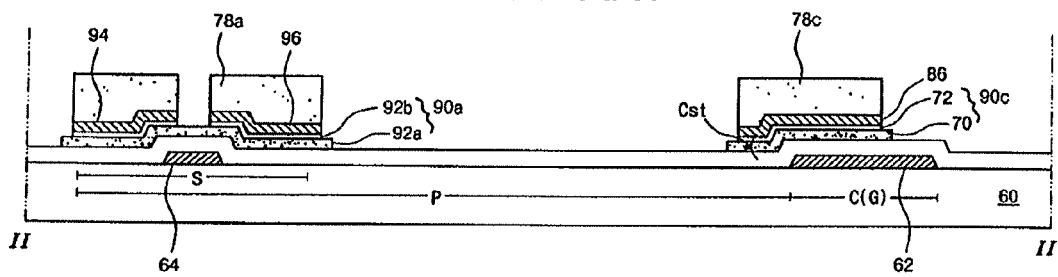
Figure 4F:
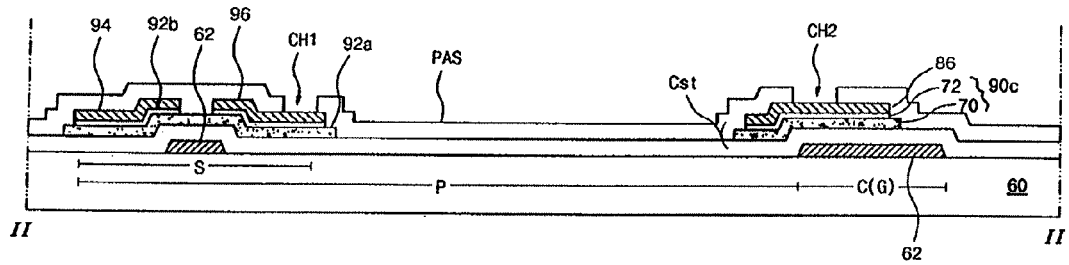
Figure 4G:
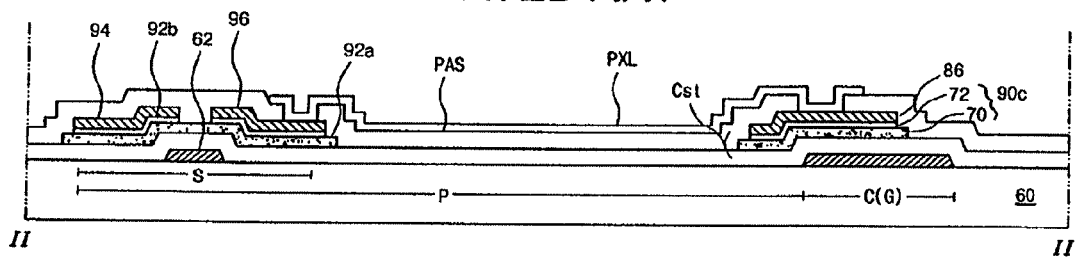
Figure 5A:
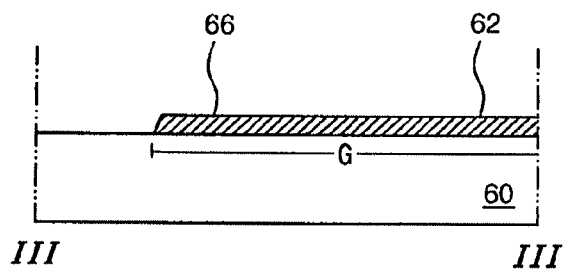
Figure 5B:
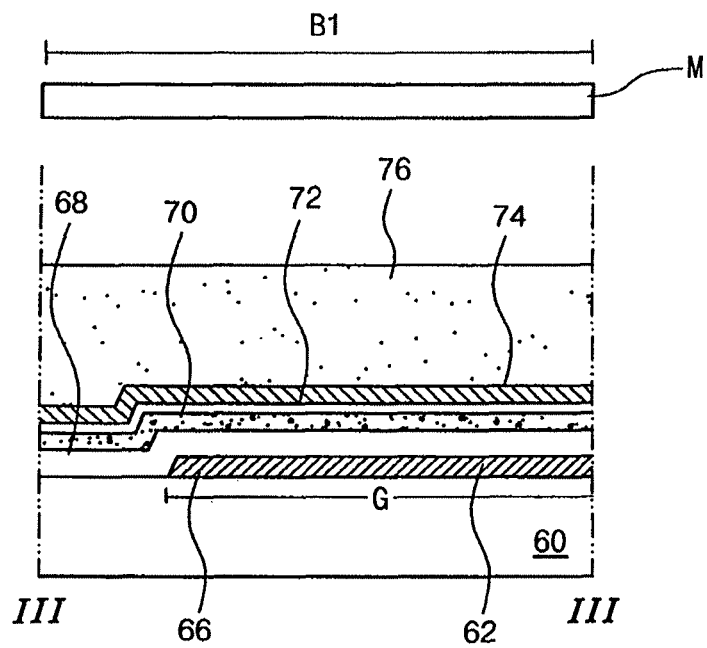
Figure 5C:
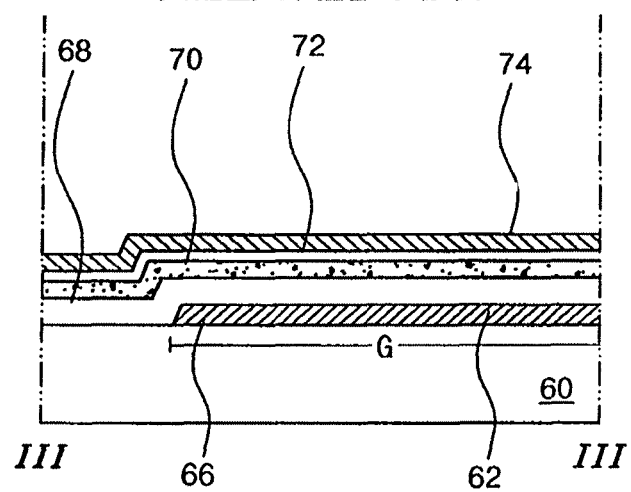
Figure 5D:
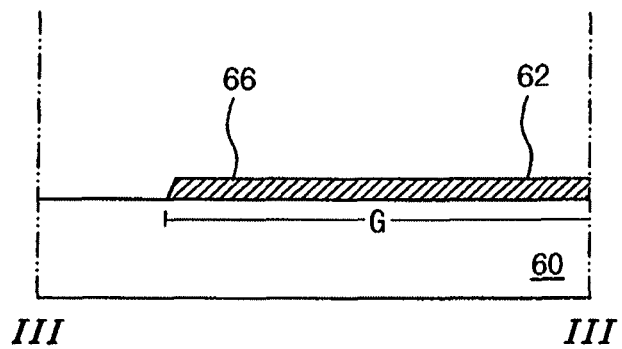
Figure 5E:
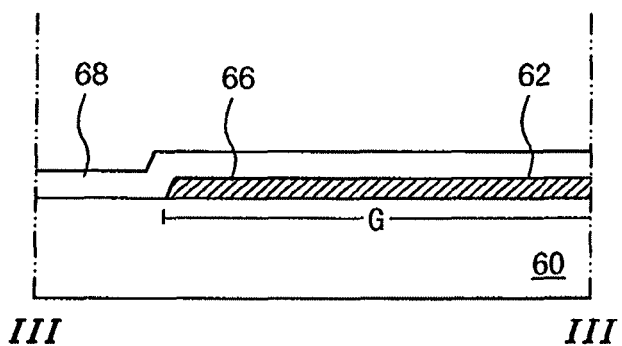
Figure 5F:
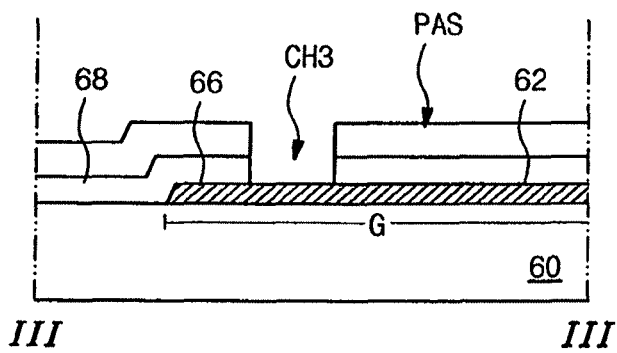
Figure 5G:
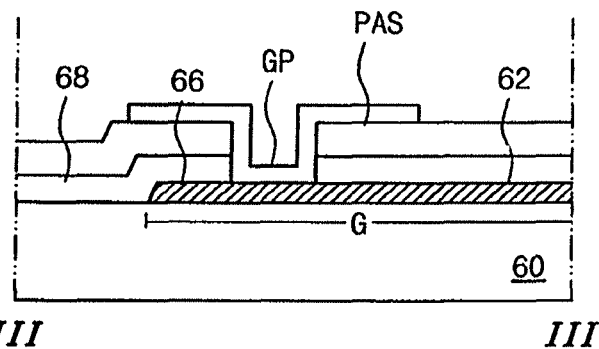
Figure 6C:
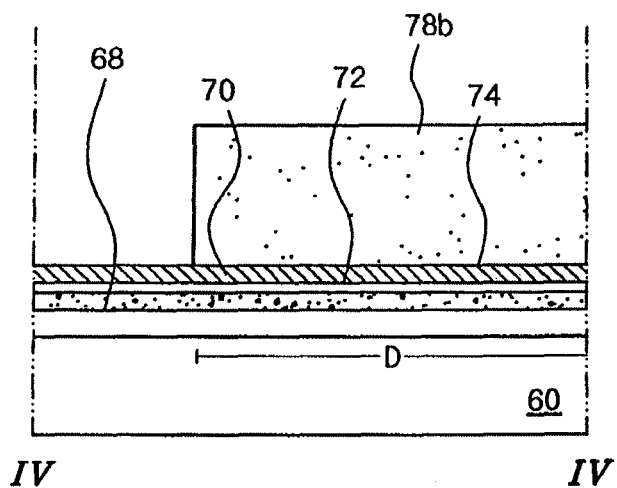
Figure 6D:
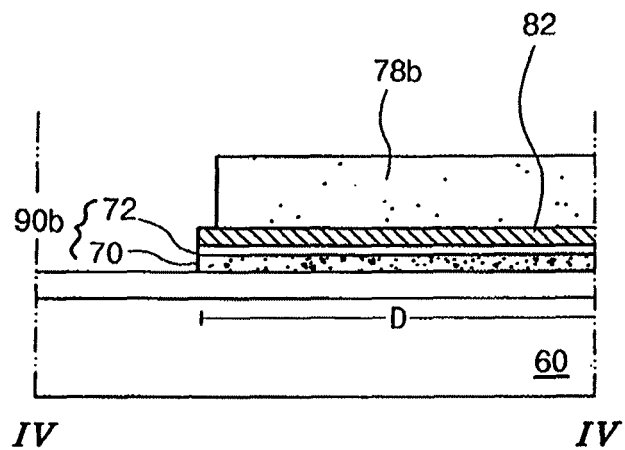
Figure 6E:
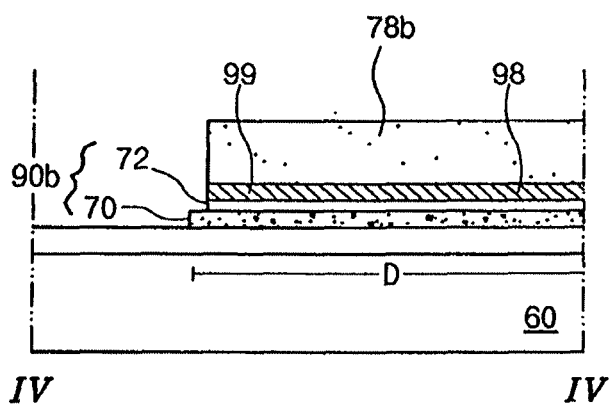
Figure 6F:
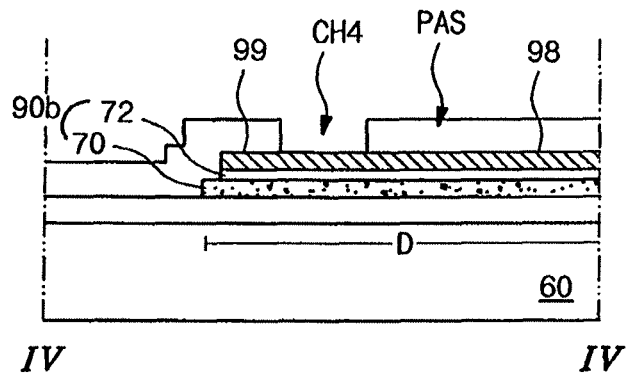
Figure 6G:
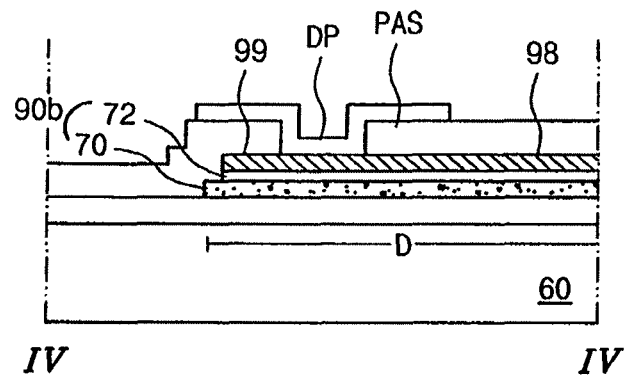
Figure 7:
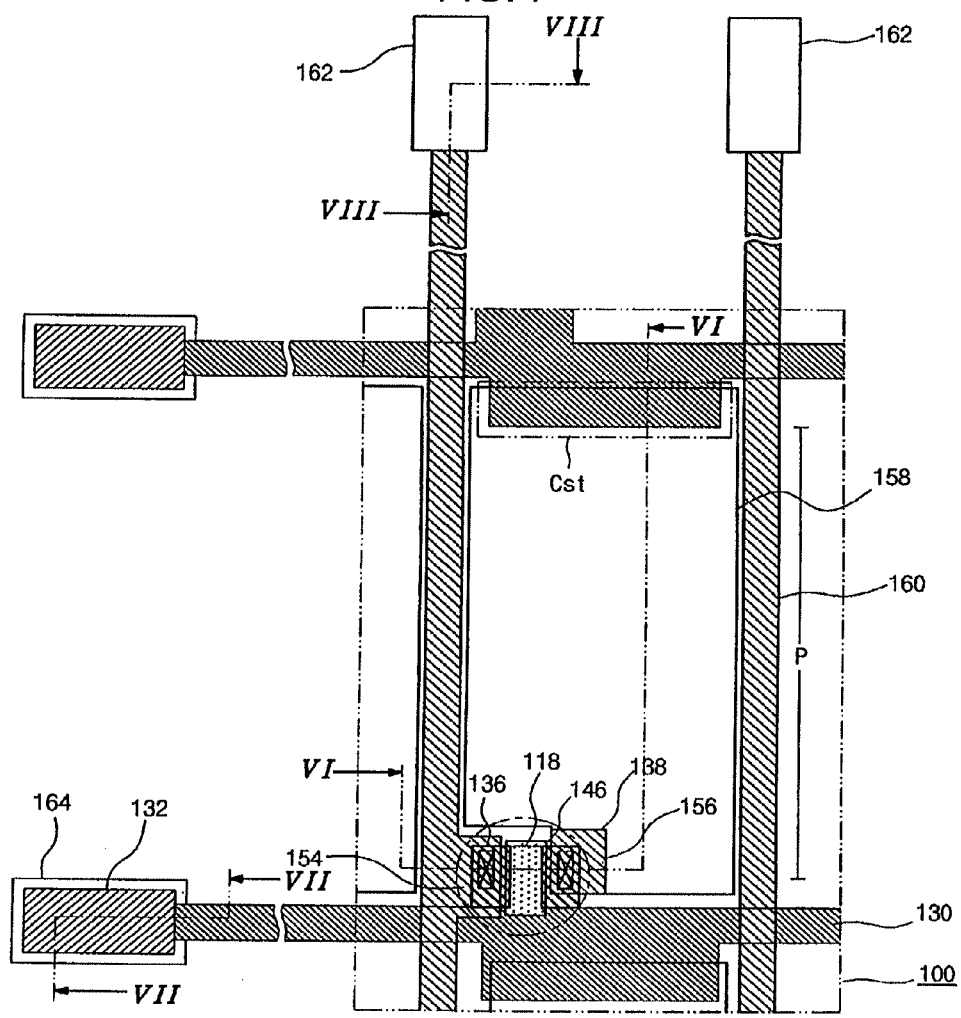
FIG. 7 is a plan view illustrating an array substrate for an LCD device according to an embodiment of the present invention.

FIG. 7 is a plan view illustrating an array substrate for an LCD device according to an embodiment of the present invention.

Referring to FIG. 7, in the array substrate for the LCD device according to the embodiment of the present invention, a gate line 130 and a data line 160 cross each other on a substrate 100 to define a pixel region P.

A gate pad 132 is disposed at one end of the gate line 130. A gate pad electrode 164 is disposed on the gate pad 132, and a data pad electrode 162 is disposed at one end of the data line 160.

A thin film transistor T is disposed near a crossing portion of the gate and data lines 130 and 160. The thin film transistor T includes a gate electrode 118, a first semiconductor layer having an active layer and an ohmic contact layer, first source and drain electrodes 136 and 138 and second source and drain electrodes 154 and 156. The first source and drain electrodes 136 and 138 contacts the ohmic contact layer. The second source and drain electrodes 154 and 156 contacts the first source and drain electrodes 136 and 138, respectively.

An etch stopper 146 is on the thin film transistor T and covers the active layer exposed between the first and second source electrodes 136 and 154 and the first and second drain electrodes 138 and 156.

A pixel electrode 158 is in the pixel region P and contacts the second drain electrode 156. A portion of the pixel electrode 158 overlapping the gate line 130 forms a storage capacitor Cst with the gate line 130. To form the storage capacitor Cst, a portion of the gate line 130 protrudes toward the pixel region P and overlaps the pixel electrode 158.

The array substrate according to the embodiment is fabricated with three mask processes.

Figure 8A:
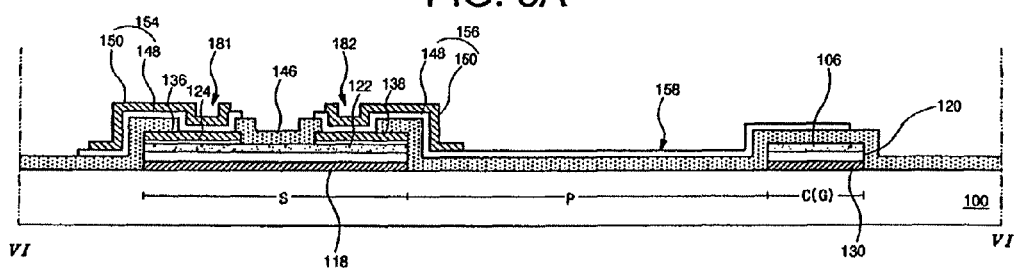
Figure 8B:
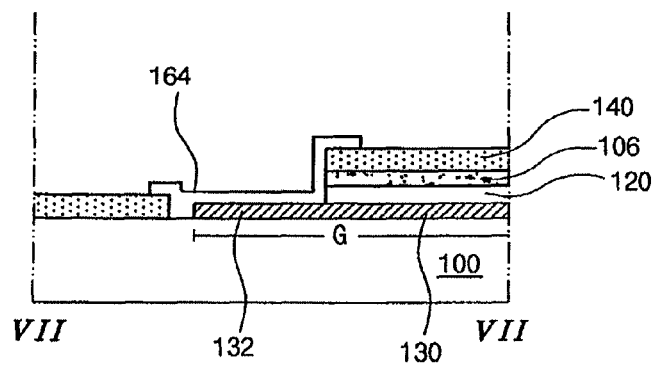

FIGS. 8A, 8B and 8C are cross-sectional views taken along lines VI-VI, VII-VII and VIII-VIII, respectively.

Referring to FIGS. 8A to 8C, a substrate 100 has a pixel region P, a gate region G, a data region D, a storage region C and a switching region S. The storage region C may be in the gate region G.

A thin film transistor (T of FIG. 7) is in the switching region S. The thin film transistor includes a gate electrode 118, a first semiconductor layer having an active layer 122 and an ohmic contact layer 124, first source and drain electrodes 136 and 138 and second source and drain electrodes 154 and 156.

A gate insulating layer 120 is on the gate electrode 118 and a gate line 130. The active layer 122 includes intrinsic amorphous silicon, and the ohmic contact layer 124 includes impurity-doped amorphous silicon.

The first source and drain electrodes 136 and 138 contacts the ohmic contact layer 124. The first source electrode 136 and the ohmic contact layer 124 therebelow may have the same island shape. The first drain electrode 138 and the ohmic contact layer 124 therebelow may have the same island shape. The first source electrode 136 and the ohmic contact layer 124 therebelow are spaced apart from the first drain electrode 138 and the ohmic contact layer 124 therebelow. The first source and drain electrodes 136 and 138 and the ohmic contact layer 124 are within the area defined by the gate electrode 118.

The second source and drain electrodes 154 and 156 contacts the first source and drain electrodes 136 and 138 through first and second contact holes 181 and 182 of a passivation layer 140, respectively. The second source and drain electrodes 154 and 156 may have a double-layered structure. For example, each of the second source and drain electrodes 154 and 156 includes a first layer 148 of a transparent material and a second layer 150 of an opaque material.

A pixel electrode 158 extends from the first layer 148 of the second drain electrode 156. The pixel electrode 158 overlaps the gate line 130 to form a storage capacitor (Cst of FIG. 7).

A portion of the active layer 122 between the first source and drain electrodes 136 and 138 is covered by an etch stopper 146. The etch stopper 146 is a portion of the passivation layer 140 covering the active layer 122 exposed between the first source and drain electrodes 136 and 138.

A data line 160 and a data pad electrode 162 are in the data region D. The data line 160 extends from the second source electrode 154. The data line 160 may have a double-layered structure having the first layer 148 and the second layer 150, as similar to the second source and drain electrodes 154 and 156. The data pad electrode 162 may have a single-layered structure. For example, the data pad electrode 162 extends from the first layer 148 of the data line 160.

The gate line 130 and a gate pad 132 are in the gate region G. A gate pad electrode 164 may have the same layer as the first layer 148 of the data line 130.

A second semiconductor layer 106 is on the gate line 130 and extends from the active layer 122. An outline of the first gate insulating layer 120, an outline of the active layer 122 and the semiconductor pattern 134, and an outline of the gate electrode 118 and the gate line 130 may substantially be the same.

As described above, the active layer is covered by the gate electrode, and thus the gate electrode shields the active layer from being exposed to light such as backlight. Accordingly, leakage current in the thin film transistor can be reduced. Further, a semiconductor layer does not protrude outside metal lines or electrodes and is not formed below the data line, and thus the coupling of the related art does not occur. Accordingly, wavy noise can be reduced and aperture ratio can increase.

FIGS. 9A to 9M, 10A to 10M and 11A to 11M are cross-sectional views, taken along lines VI-VI, VII-VII and VIII-VIII of FIG. 7, illustrating a method of fabricating an array substrate for an LCD device according to the embodiment of the present invention.

Figure 9A:
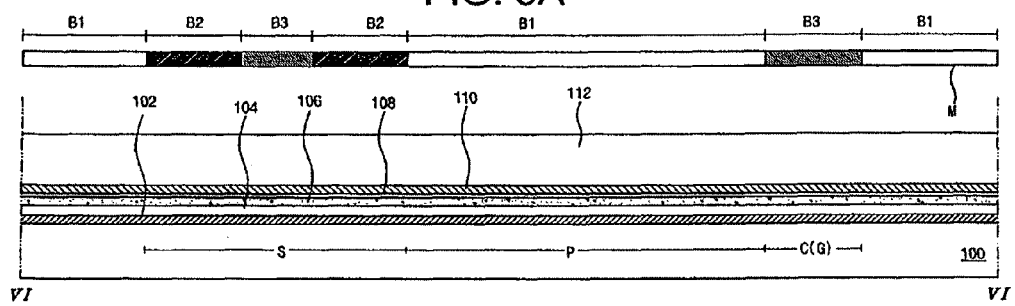
Figure 10A:
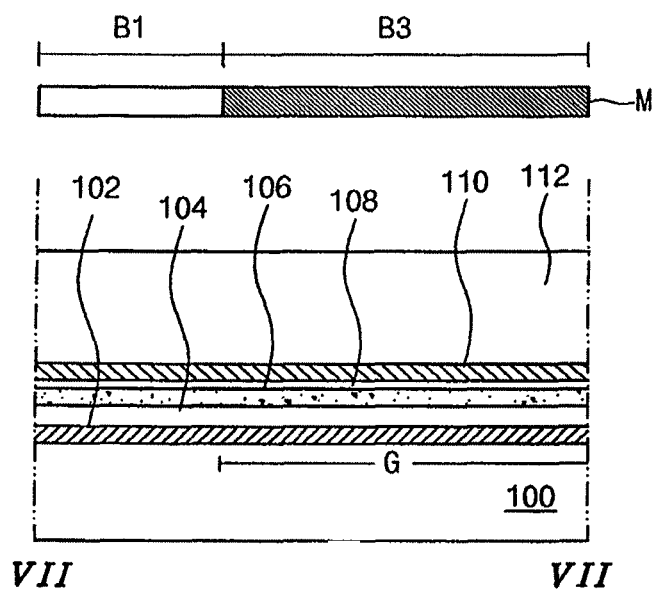

Referring to FIGS. 9A, 10A and 11A, a first conductive layer 102, a first insulating layer 104, an intrinsic amorphous silicon layer 106 and an impurity-doped amorphous silicon layer 108 and a second conductive layer 110 are formed on a substrate 100 having a pixel region P, a switching region S, a gate region G, a data region D and a storage region C. The storage region C may be in the gate region G.

Each of the first and second conductive layers 102 and 110 includes one or more of aluminum (Al), aluminum alloy (AlNd), tungsten (W), chromium (Cr), molybdenum (Mo), titanium (Ti), copper (Cu) and tantalum (Ta). At least one of the conductive materials may be deposited for each of the first and second conductive layers 102 and 110 to have a single or multiple-layered structure. The first conductive layer 102 may use aluminum (Al) having a low resistance and conductive materials protecting aluminum (Al). The second conductive layer 110 may use conductive materials to be dry-etched, for example, molybdenum (Mo). The first insulating layer 104 includes one or more of silicon nitride (SiNx) and silicon oxide ($SiO_2$).

A photoresist layer 112 is formed on the second conductive layer 110. A first mask M having a transmitting portion B1, a blocking portion B2 and a semi-transmitting portion B3 is over the photoresist layer 112. The semi-transmitting portion B3 has a slit structure or semi-transmitting film so that light intensity or transmissivity passing through the semi-transmitting portion B3 can be lower than the transmitting portion B1.

A portion of the storage region S corresponds to a semi-transmitting portion B3, and both sides of the portion of the storage region S corresponds to the blocking portion B2. The gate region G and the storage region C corresponds to the semi-transmitting portion B3. The transmitting portion B1 may be between the semi-transmitting portions B3 and the blocking portions B2. The photoresist layer 112 is exposed to light using the first mask M and developed.

Figure 9B:
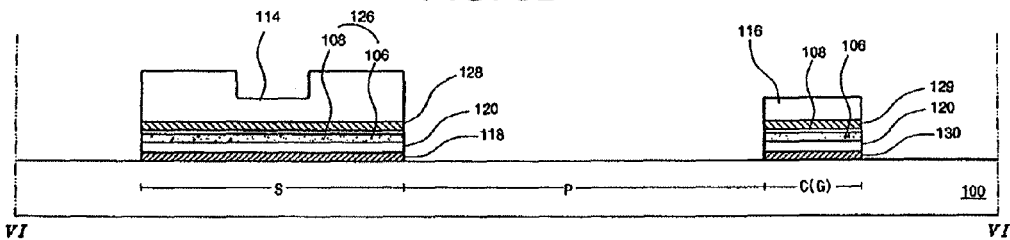
Figure 10B:
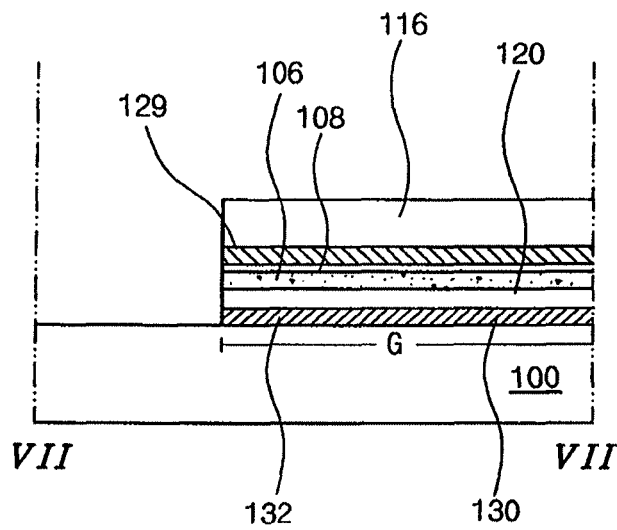
Figure 11B:
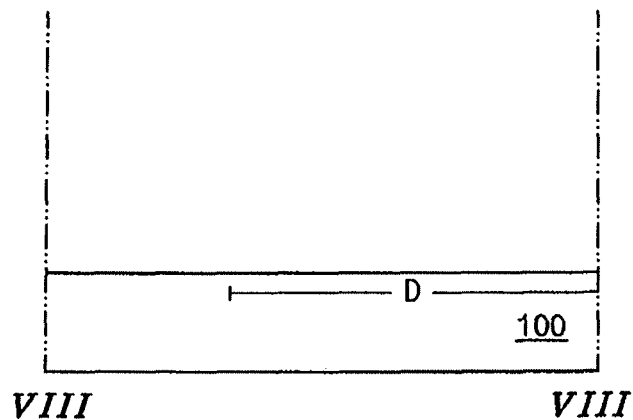

Referring to FIGS. 9B, 10B and 11B, by the exposure and developing, a first photoresist pattern 114 is formed corresponding to the switching region S, and a second photoresist pattern 116 is formed corresponding to the gate region G and the storage region C. A portion of the first photoresist pattern 114 and the second photoresist pattern 116 corresponding to the semi-transmitting portion (B3 of FIGS. 9A and 10A) have a thickness thinner than other portion of the first photoresist pattern 114 corresponding to the blocking portion (B2 of FIG. 9A).

The first conductive layer (102 of FIGS. 9A, 10A and 11A), the first insulating layer (104 of FIGS. 9A, 10A and 11A), the intrinsic amorphous silicon layer (106 of FIGS. 9A, 10A and 11A) and the impurity-doped amorphous silicon layer (108 of FIGS. 9A, 10A and 11A) and the second conductive layer (110 of FIGS. 9A, 10A and 11A) are etched using the first and second photoresist patterns 114 and 116. When the second conductive layer is made of a material to be dry-etched, the second conductive layer, the impurity-doped amorphous silicon layer, the intrinsic amorphous silicon layer and the first insulating layer may be simultaneously dry-etched. When the second conductive layer is made of other material, the second conductive layer may be etched, and then the impurity-doped amorphous silicon layer, the intrinsic amorphous silicon layer and the first insulating layer may be simultaneously dry-etched. After etching the second conductive layer, the impurity-doped amorphous silicon layer, the intrinsic amorphous silicon layer and the first insulating layer, the first conductive layer may be etched, for example, wet-etched when the first conductive layer includes aluminum (Al) or aluminum alloy (AlNd). Alternatively, the first conductive layer may be etched along with the layers thereon.

By the etching, a gate electrode 118, a gate insulating layer 120, a first semiconductor layer 126 and a source-drain pattern 128 are formed corresponding to the switching region S. A gate line 130, a gate pad 132, the gate insulating layer 120, and a conductive pattern 129 are formed corresponding to the gate region G. The first semiconductor layer 126 has the amorphous silicon layer 106 and the impurity-doped amorphous silicon layer 108.

An ashing process is performed for the first and second photoresist patterns 114 and 116 to remove the thinner portion of the first photoresist pattern 114 and the second photoresist pattern 116. The source-drain pattern 128, the conductive pattern 129 and the impurity-doped amorphous silicon layer 108 are etched using the ashed first and second photoresist patterns 114 and 116.

Figure 9C:
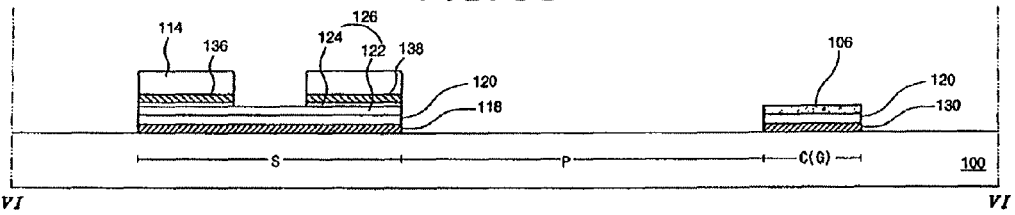
Figure 11C:
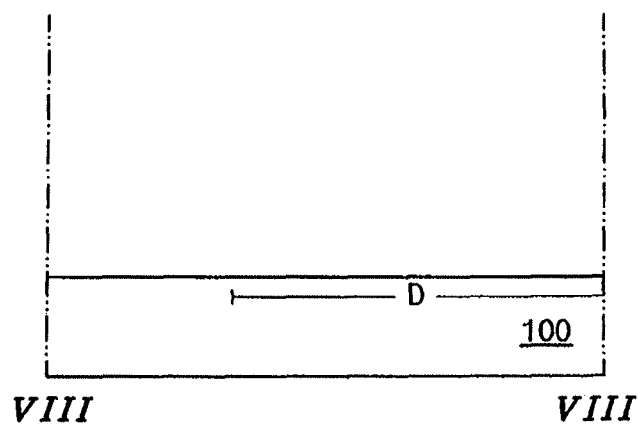

Referring to FIGS. 9C, 10C and 11C, by the etching, first source and drain electrodes 136 and 138 spaced apart from each other are formed in the switching region S. A portion of the impurity-doped amorphous silicon layer of the first semiconductor layer 126 between the first source and drain electrodes 136 and 138 are removed. The impurity-doped amorphous silicon layer of the first semiconductor layer 126 is referred to as an ohmic contact layer 124. The intrinsic amorphous silicon layer of the first semiconductor layer 126 is referred to as an active layer 122. The conductive pattern (129 of FIGS. 9B and 10B) and the impurity-doped amorphous silicon layer therebelow are removed. The intrinsic amorphous silicon layer 106 over the gate line 130 and the gate pad 132 is referred to as a second semiconductor layer 106.

Through the above-described processes, the first mask process is performed.

Figure 9D:
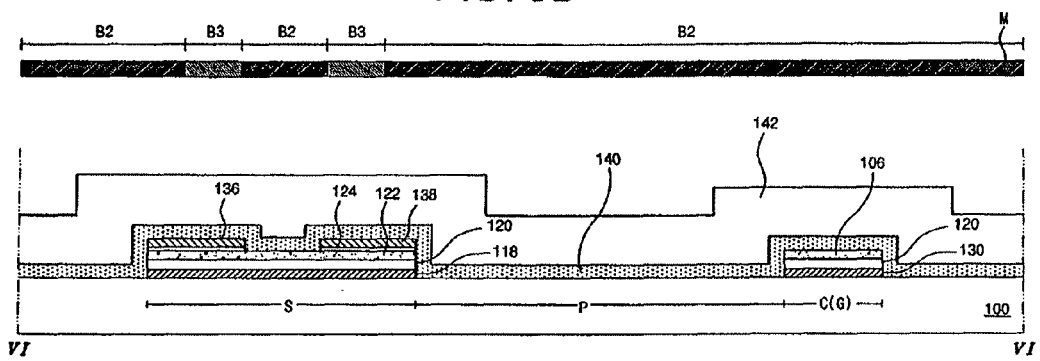
Figure 11D:
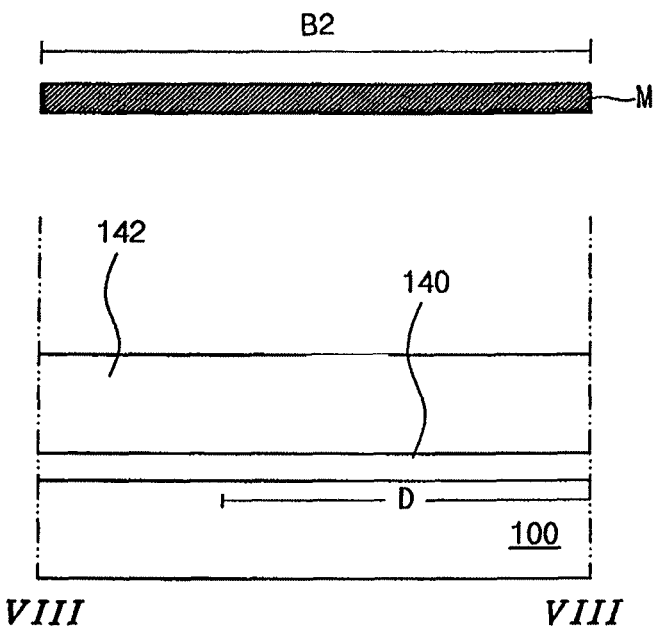

Referring to FIGS. 9D, 10D and 11D, a second insulating layer 140 is formed on the substrate 100 having the first source and drain electrodes 136 and 138. A photoresist layer 142 is formed on the second insulating layer 140. The second insulating layer 140 includes one or more of silicon nitride (SiNx) and silicon oxide ($SiO_2$). The second insulating layer 140 is referred to as a passivation layer 140.

A second mask M having a transmitting portion B1, a blocking portion B2 and a semi-transmitting portion B3 is over the photoresist layer 142.

A portion of each of the first source and drain electrodes 136 and 138 corresponds to the semi-transmitting portion B3. The gate pad 132 corresponds to the transmitting portion B1. The blocking portion B2 may be between the transmitting portion B1 and the semi-transmitting portions B3. The blocking portion B2 between the semi-transmitting portions B3 corresponding to the portions of the first source and drain electrodes 136 and 138 covers the active layer 122 between the first source and drain electrodes 136 and 138.

The photoresist layer 142 is exposed to light using the second mask M and developed.

Figure 9E:
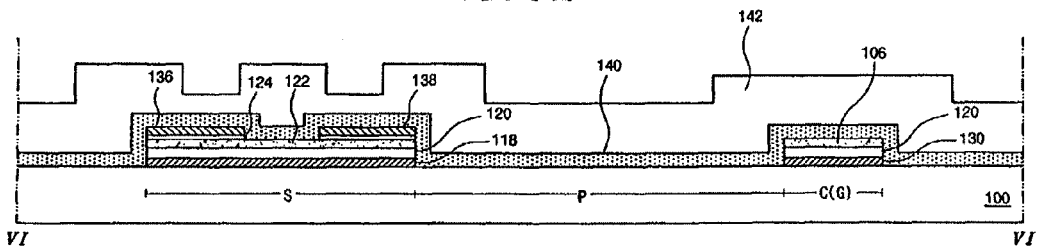
Figure 10E:
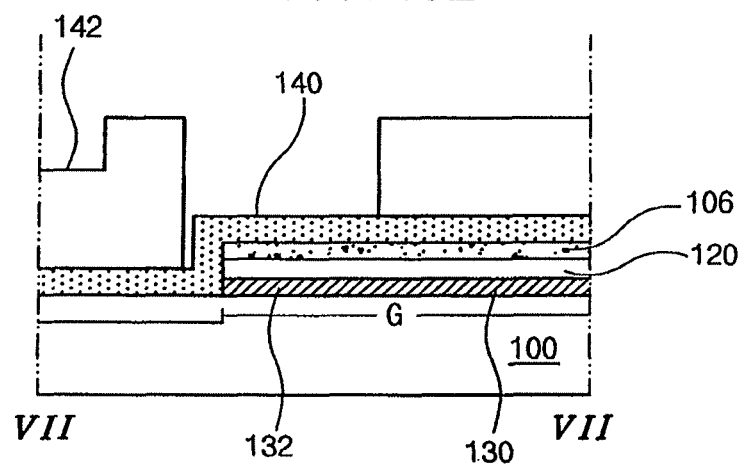
Figure 11E:
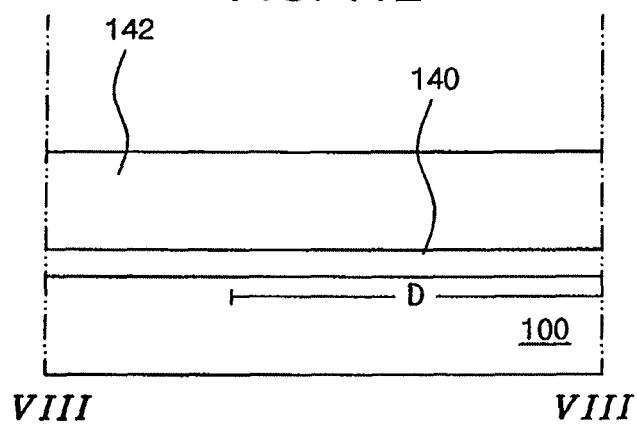

Referring to FIGS. 9E, 10E and 11E, by the exposure and developing, a photoresist pattern 142 is formed. A portion of the photoresist pattern 142 corresponding to the semi-transmitting portion (B3 of FIG. 9D) has a thickness thinner than other portion of the photoresist pattern 142. The passivation layer 140 over the gate pad 132 is exposed.

The passivation layer 140, the second semiconductor layer 106 and the gate insulating layer 120 over the gate pad 132 are etched using the photoresist pattern 142.

Figure 9F:
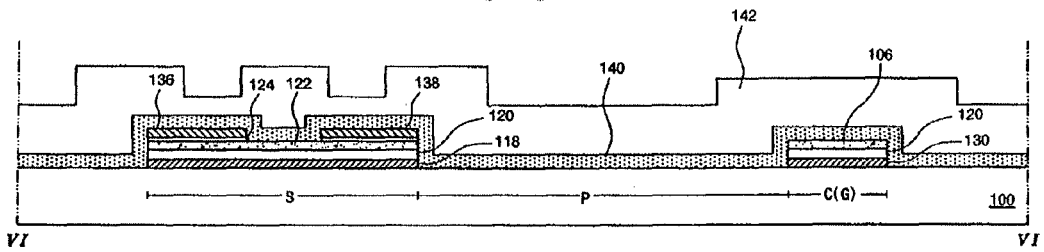
Figure 10F:
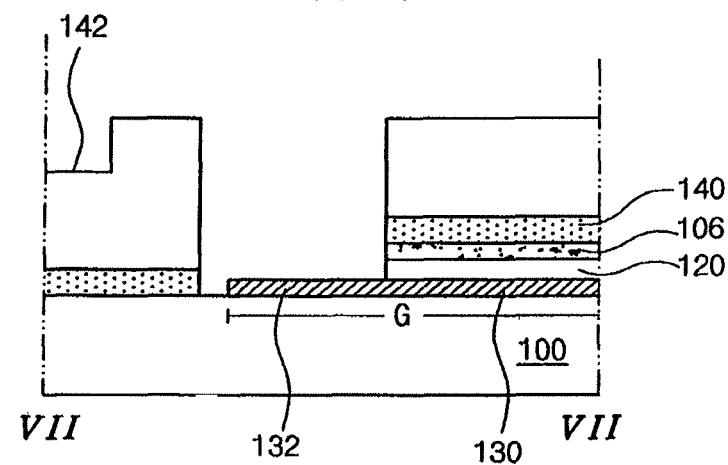
Figure 11F:
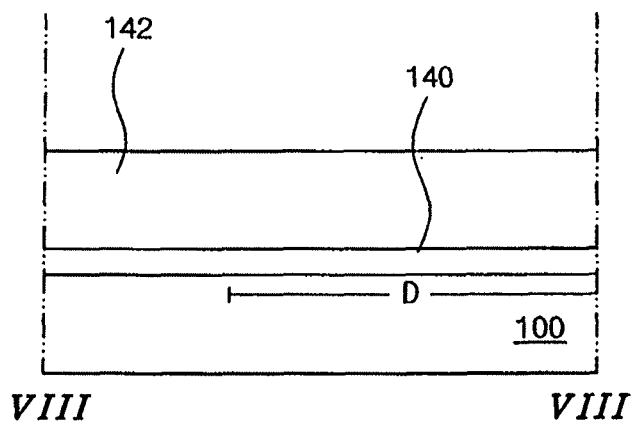

Referring to FIGS. 9F, 10F and 11F, by the etching, the gate pad 132 is exposed.

Figure 9G:
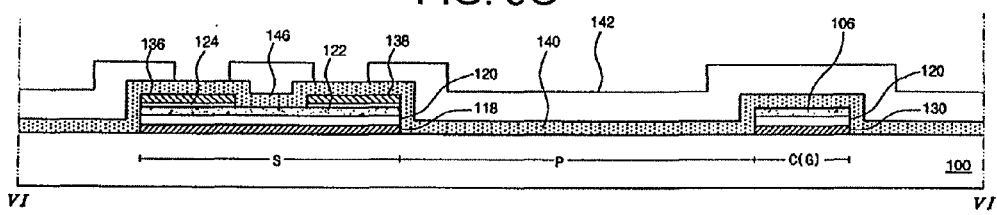
Figure 10G:
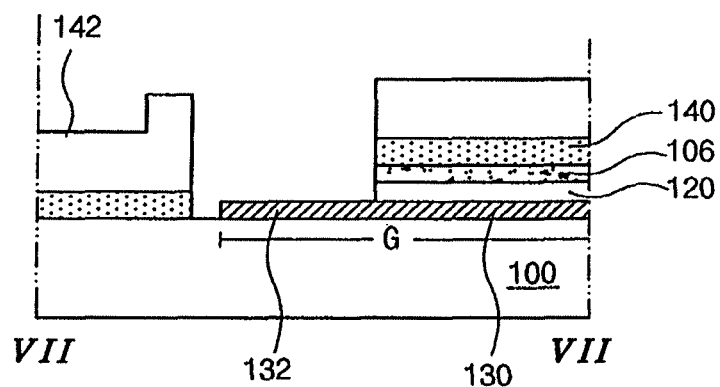
Figure 11G:
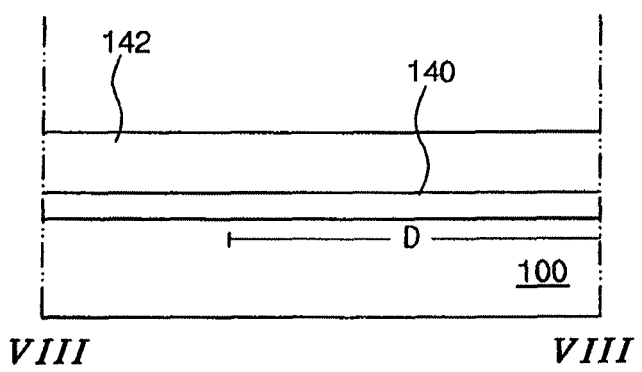

Referring to FIGS. 9G, 10G and 11G, an ashing process is performed to remove the thinner portion of the photoresist pattern 142. The passivation layer 140 is etched using the ashed photoresist pattern 142.

Figure 9H:
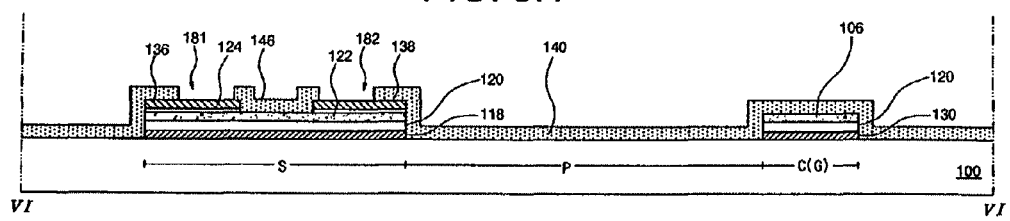
Figure 10H:
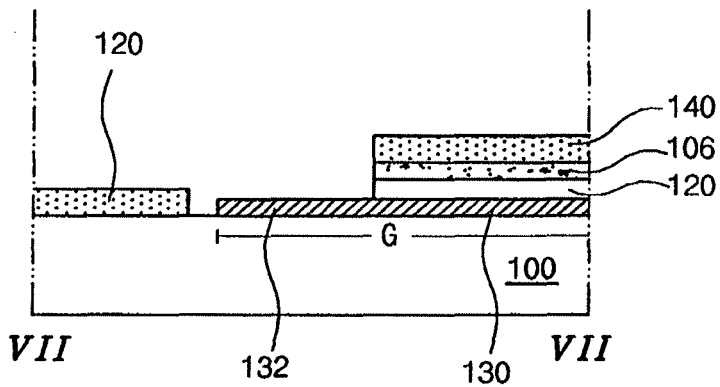
Figure 11H:
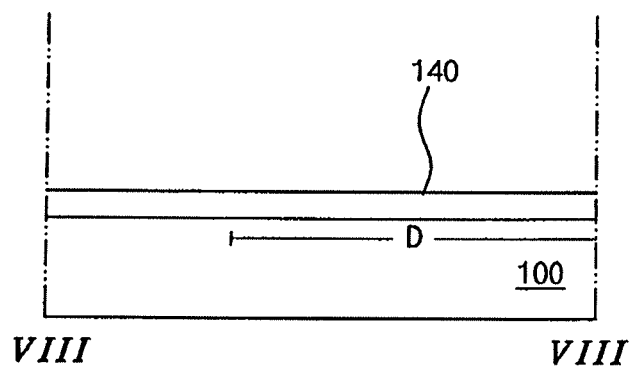

Referring to FIGS. 9H, 10H and 11H, by the etching, first and second contact holes 181 and 182 exposing the first source and drain electrodes 136 and 138, respectively, are formed in the passivation layer 140. A portion of the passivation layer 140 between the first and second contact holes 181 and 182 covers the portion of the active layer 122 between the first source and drain electrodes 136 and 138, and the portion of the passivation layer 140 is referred to as an etch stopper 146. The etch stopper 146 protects the active layer 122 from contamination or damage by following processes.

Through the above-described processes, a second mask process is performed.

Figure 9I:
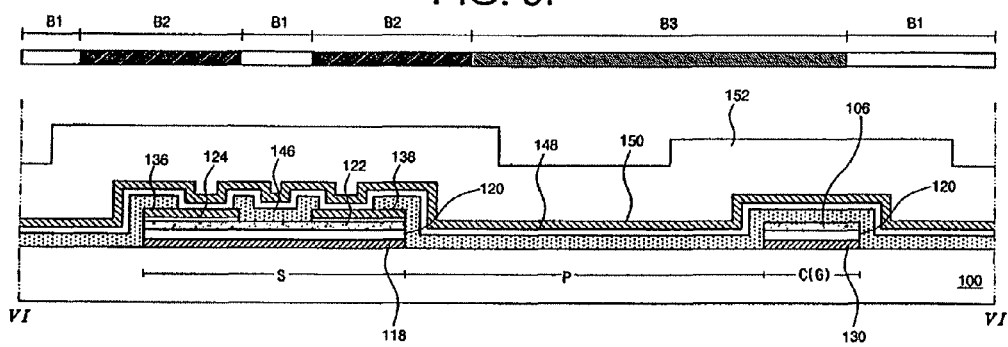
Figure 10I:
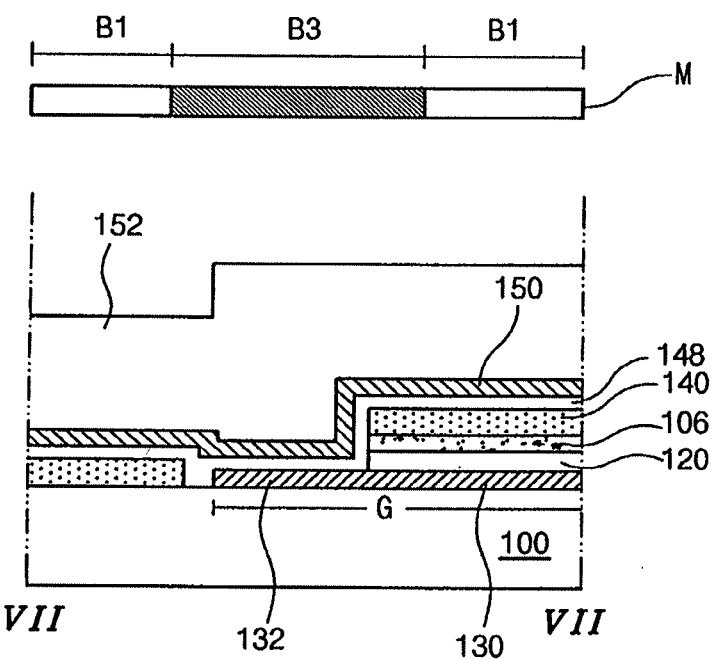
Figure 11I:
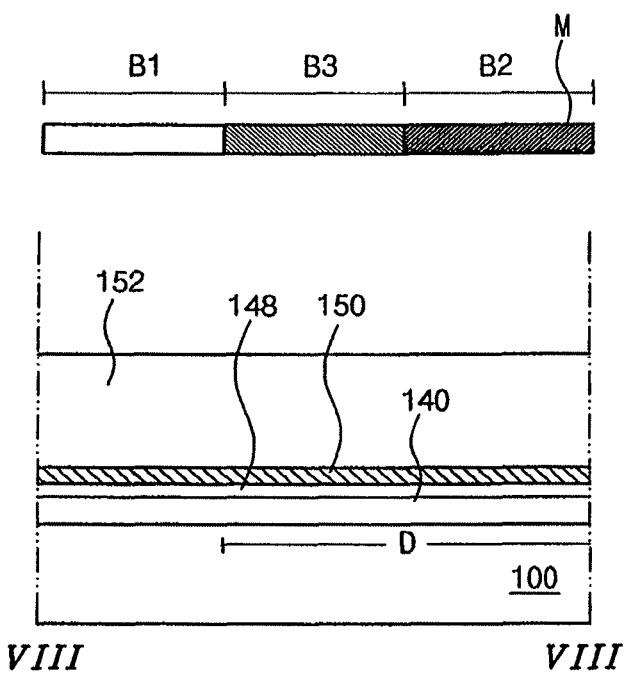

Referring to FIGS. 9I, 10I and 11I, first and second layers 148 and 150 are formed on the passivation layer 140. The first layer 148 may be a transparent conductive layer 148 including one or more of indium-tin-oxide (ITO), indium-zinc-oxide (IZO) and indium-tin-zinc-oxide (ITZO). The second layer 150 may be an opaque conductive layer 150 including one or more of aluminum (Al), aluminum alloy (AlNd), tungsten (W), chromium (Cr), molybdenum (Mo), titanium (Ti), copper (Cu) and tantalum (Ta).

A photoresist layer 152 is formed on the second conductive layer 150. A third mask M having a transmitting portion B1, a blocking portion B2 and a semi-transmitting portion B3 is over the photoresist layer 152.

The blocking portions B2 are at both sides of the transmitting portion B1 corresponding to the etch stopper 146. The pixel region P and the storage region C correspond to the semi-transmitting portion B3. The gate pad 132 corresponds to the semi-transmitting portion B3. The data region D corresponds to the blocking portion B2, and one end of the data region D corresponds to the semi-transmitting portion B3. The transmitting portion B1 may be between the semi-transmitting portions B3 and the blocking portions B2. The photoresist layer 152 is exposed to light using the third mask M and developed.

Figure 9J:
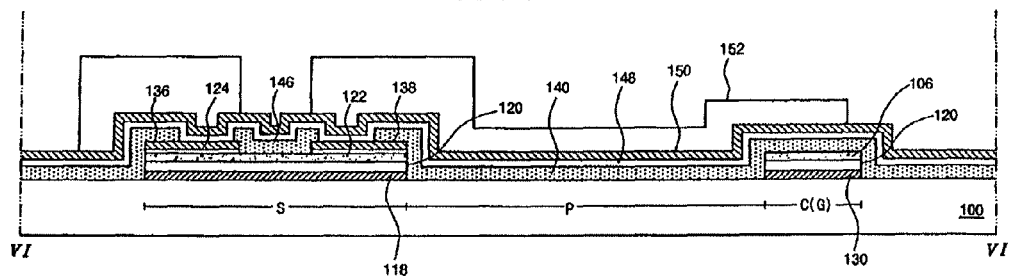
Figure 10J:
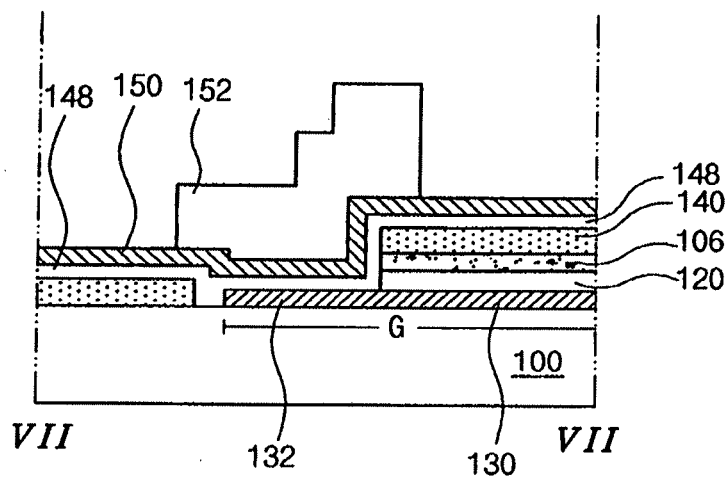
Figure 11J:
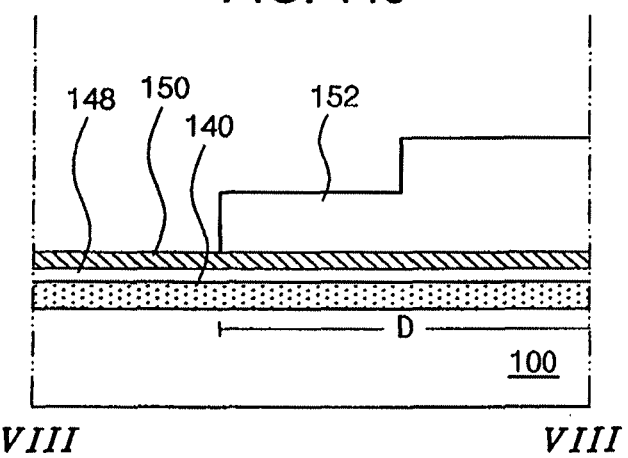

Referring to FIGS. 9J, 10J and 11J, by the exposure and developing, a photoresist pattern 152 is formed. A portion of the photoresist pattern 152 corresponding to the semi-transmitting portion (B3 of FIGS. 9I, 10I and 11I) has a thickness thinner than other portion of the photoresist pattern 152. The second layer 150 corresponding to the transmitting portion (B1 of FIGS. 9I, 10I and 11I) is exposed. The second layer 150 and the first layer 148 are etched using the photoresist pattern 152.

Figure 9K:
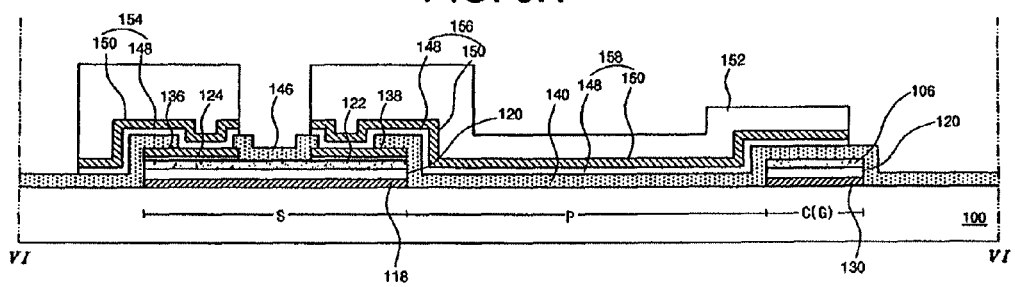
Figure 10K:
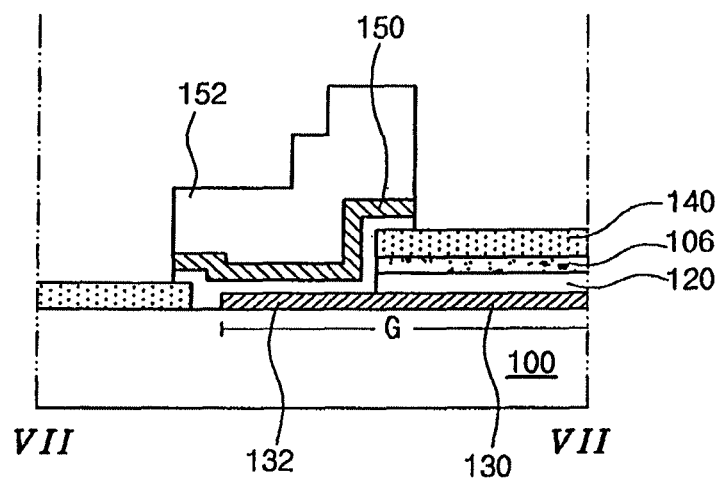
Figure 11K:
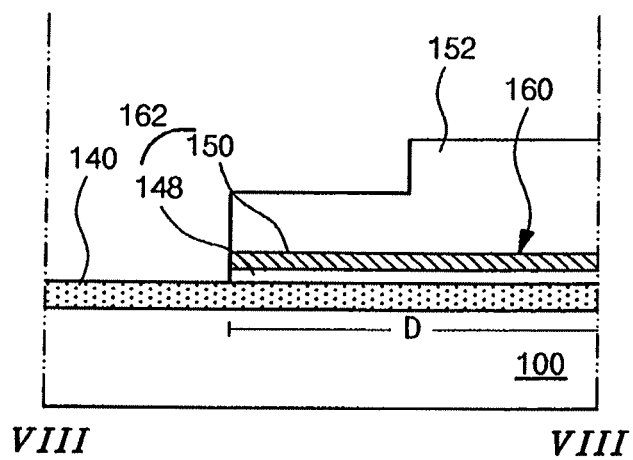

Referring to FIGS. 9K, 10K and 11K, by the etching, second source and drain electrodes 154 and 156 spaced apart from each other are formed in the switching region S. A pixel pattern 158 extending from the second drain electrode 156 is formed in the pixel region P. A data line 160 and a data pad pattern 162 are formed in the data region D. Each of the second source and drain electrodes 154 and 156, the pixel pattern 158, the data line 160 and the data pad pattern 162 has the first and second layers 148 and 150. The first and second layers 148 and 150 are on the gate pad 132.

Figure 9L:
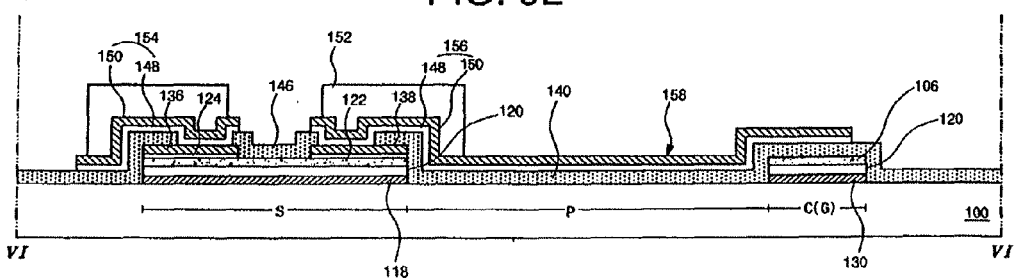
Figure 10L:
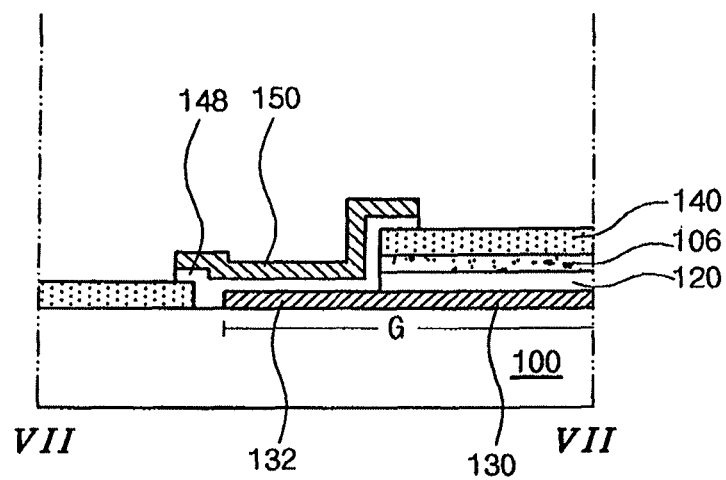
Figure 11L:
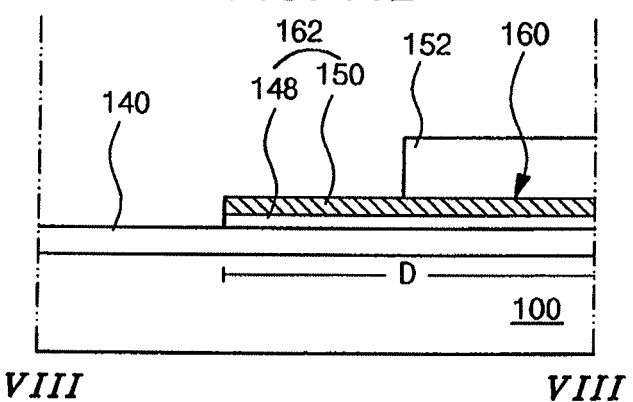

Referring to FIGS. 9L, 10L and 11L, an ashing process is performed to remove the thinner portion of the photoresist pattern 152. The second layer 150 of the pixel pattern 158 and the data pad pattern 162 and the second layer 150 over the gate pad 132 are exposed. The second layer 150 is etched using the ashed photoresist pattern 152.

Figure 9M:
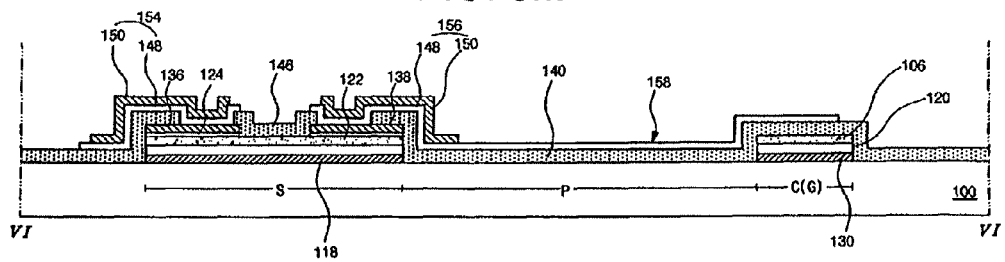

Referring to FIGS. 9M, 10M and 11M, by the etching, the pixel pattern 158 and the data pad pattern 162 has the first layer 148. The first layer 148 remains on the gate pad 132. The pixel pattern 158 having the first layer 148 is referred to as a pixel electrode 158. The data pad pattern 162 having the first layer 148 is referred to as a data pad electrode 162. The first layer 148 over the gate pad 132 is referred to as a gate pad electrode 164.

Through the above-described processes, a third mask process is performed.

Through the above-described processes, the array substrate for the LCD device is fabricated. By attaching the array substrate and a substrate opposing the array substrate, for example, a color filter substrate, and interposing a liquid crystal layer between the two substrates, the LCD device is fabricated.

As explained above, the array substrate is fabricated with the three mask processes. Accordingly, fabrication time and product cost can be reduced. Further, the active layer is covered by the gate electrode, and thus the gate electrode shields the active layer from being exposed to light such as backlight. Accordingly, leakage current in the thin film transistor can be reduced. Further, a semiconductor layer does not protrude outside metal lines or electrodes and is not formed below the data line, and thus the coupling of the related art does not occur. Accordingly, wavy noise can be reduced and aperture ratio can increase.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device comprising:

using a first mask process to form a gate line, a gate pad extending from the gate line and a gate electrode on a substrate, a gate insulating layer on the gate electrode and the gate line, an active layer on the gate insulating layer over the gate electrode, an ohmic contact layer on the active layer, and first source and drain electrodes on the ohmic contact layer;

using a second mask process to form a passivation layer covering the active layer between the first source and drain electrodes; and using a third mask process to form a second source and drain electrodes connected to the first source and drain electrodes, respectively, a data line extending from the source electrode and crossing the gate line to define a pixel region, a data pad electrode extending from the data line, and a pixel electrode in the pixel region and extending from the second drain electrode.

2. The method according to claim 1, further comprising forming a semiconductor layer extending from the active layer and over the gate line.

3. The method according to claim 2, wherein using the first mask process to form the gate line, the gate pad, the gate electrode, the gate insulating layer, the active layer, the semiconductor layer, the ohmic contact layer, and the first source and drain electrodes comprises:
    forming a first conductive layer, a first insulating layer, an intrinsic amorphous silicon layer, an impurity-doped amorphous silicon layer and a second conductive layer on the substrate;
    forming a first photoresist pattern on the second conductive layer using the first mask, wherein the first photoresist pattern has a first portion corresponding to a portion of a switching region and a gate region, and a second portion corresponding to both sides of the portion of the switching region, and wherein the second portion is thicker than the first portion;
    patterning the second conductive layer, the impurity-doped amorphous silicon layer, the intrinsic amorphous silicon layer, the first insulating layer and the first conductive layer using the first photoresist pattern to form the gate line, the gate pad and the semiconductor layer in the gate region, the gate electrode and the active layer in the switching region, and the gate insulating layer in the gate region and the switching region;
    ashing the first photoresist pattern to remove the first portion; and
    patterning the patterned second conductive layer and impurity-doped amorphous silicon layer using the ashed first photoresist pattern to form the first source and drain electrodes and the ohmic contact layer.

4. The method according to claim 3, wherein forming the first photoresist pattern comprises:
    forming a photoresist layer on the second conductive layer;
    exposing the photoresist layer to light using the first mask, wherein a semi-transmitting portion of the first mask corresponds to the portion of the switching region and the gate region, and a blocking portion of the first mask corresponds to the both sides of the portion of the switching region; and
    developing the light-exposed photoresist layer.

5. The method according to claim 3, wherein using the second mask process to form the passivation layer comprises forming first and second contact holes exposing the first source and drain electrodes, respectively.

6. The method according to claim 5, wherein forming the passivation layer using the second mask comprises:
    forming a second insulating layer on the substrate having the first source and drain electrodes;
    forming a second photoresist pattern on the second insulating layer using the second mask, wherein the second photoresist pattern has a third portion corresponding to a portion of each of the first source and drain electrodes, and a fourth portion thicker than the third portion, and wherein at least portion of the gate pad is not covered by the second photoresist pattern;
    patterning the second insulating layer, the semiconductor layer and the gate insulating layer using the second photoresist pattern to expose the portion of the at least gate pad;
    ashing the second photoresist pattern to remove the third portion; and
    patterning the patterned second insulating layer to form the passivation layer having the first an second contact holes.

7. The method according to claim 6, wherein forming the second photoresist pattern comprises:
    forming a photoresist layer on the second insulating layer;
    exposing the photoresist layer to light using the second mask, wherein a transmitting portion of the second mask corresponds to the at least portion of the gate pad, and a semi-transmitting portion of the second mask corresponds to the portion of each of the first source and drain electrodes; and
    developing the light-exposed photoresist layer.

8. The method according to claim 1, wherein each of the data line and the second source and drain electrodes comprises first and second layers.

9. The method according to claim 8, wherein the pixel electrode extends from the first layer of the second drain electrode, and the data pad electrode extends from the first layer of the data line.

10. The method according to claim 9 further comprising forming a gate pad electrode on the gate pad and including the first layer.

11. The method according to claim 10, wherein the first layer comprises a transparent material and the second layer comprises an opaque material.

12. The method according to claim 11, wherein the first layer comprises one or more of indium-tin-oxide, indium-zinc-oxide and indium-tin-zinc-oxide, and the second layer comprises one or more of aluminum (Al), aluminum alloy, tungsten (W), chromium (Cr), molybdenum (Mo), titanium (Ti), copper (Cu) and tantalum (Ta).

13. The method according to claim 10, wherein using the third mask process to form the data line, the data pad electrode, the second source and drain electrodes, the pixel electrode, and the gate pad electrode comprises:
    forming the first and second layers on the passivation layer;
    forming a photoresist pattern on the second layer using the third mask, wherein the photoresist pattern has a first portion corresponding to at least portion of the gate pad, one end of a data region and the pixel region, and a second portion corresponding to a second portion of the data region and thicker than the first portion, and wherein at least portion of the passivation layer that covers the active layer between the first source and drain electrodes is not covered by the photoresist pattern;
    patterning the second layer and the first layer using the photoresist pattern to form the data line in the second portion of the data region and the second source and drain electrodes;
    ashing the photoresist pattern to remove the first portion; and
    patterning the patterned second layer to form the data pad electrode at the one end of the data region, the pixel electrode in the pixel region and the gate pad electrode.

14. The method according to claim 13, wherein forming the photoresist pattern comprises:
    forming a photoresist layer on the second layer;
    exposing the photoresist layer to light using the third mask, wherein a semi-transmitting portion of the third mask corresponds to the at least portion of the gate pad, the one end of the data region and the pixel region, wherein a blocking portion of the third mask corresponds to the second portion of the data region, and wherein a transmitting portion of the third mask corresponds to the at least portion of the passivation layer that covers the active layer between the first source and drain electrodes; and developing the light-exposed photoresist layer.

15. The method according to claim 1, wherein the pixel electrode overlaps the gate line.

16. The method according to claim 15, wherein a portion of the gate line overlapping the pixel electrode protrudes toward the pixel region.

* * * * *